(12) United States Patent
Nitadori et al.

(10) Patent No.: US 7,922,485 B2  
(45) Date of Patent: Apr. 12, 2011

(54) VERTICAL TYPE HEAT PROCESSING APPARATUS AND VERTICAL TYPE HEAT PROCESSING METHOD

(75) Inventors: Hiromi Nitadori, Oshu (JP); Katsuyuki Hishiya, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 450 days.

(21) Appl. No.: 12/068,560

(22) Filed: Feb. 7, 2008

(65) Prior Publication Data

US 2008/0193888 A1    Aug. 14, 2008

(30) Foreign Application Priority Data

Feb. 14, 2007 (JP) ................... 2007-033665  
Jul. 27, 2007 (JP) ................... 2007-195591

(51) Int. Cl.  
  *F27D 3/12* (2006.01)  
(52) U.S. Cl. ............. 432/241; 432/6; 414/940  
(58) Field of Classification Search .......... 219/209, 219/390, 405, 406; 438/715, 716; 432/6, 432/241, 243, 247, 249; 414/935, 837, 940, 414/941

See application file for complete search history.

(56) References Cited

U.S. PATENT DOCUMENTS

| | | | | |
|---|---|---|---|---|
| 5,048,164 A | * | 9/1991 | Harima | 29/25.01 |
| 5,055,036 A | * | 10/1991 | Asano et al. | 432/5 |
| 5,236,181 A | * | 8/1993 | Ishii et al. | 266/252 |
| 5,407,181 A | * | 4/1995 | Ohsawa | 266/257 |
| 5,725,664 A | * | 3/1998 | Nanbu et al. | 118/52 |
| 5,829,969 A | * | 11/1998 | Miyashita et al. | 432/253 |

(Continued)

FOREIGN PATENT DOCUMENTS

JP    10-107019    4/1998

(Continued)

OTHER PUBLICATIONS

Japanese Office Action issued on Jun. 9, 2009 for Japanese Patent Application No. 2007-195591 with English translation.

(Continued)

*Primary Examiner* — Gregory A Wilson  
(74) *Attorney, Agent, or Firm* — Smith, Gambrell & Russell, LLP

(57) ABSTRACT

Disclosed is a vertical type heat processing apparatus and a vertical type heat processing method, which can prevent fall down of the boat on a boat carrier mechanism to be caused by an external force, such as an earthquake or the like, by employing a simple structure, while taking a form of the two-boat system. The vertical type heat processing apparatus 1 includes a heating furnace 5 having a furnace port 5a, a cover 17 adapted to close the furnace port 5a, a pair of substrate holding tools 4 each adapted to hold multiple substrates W in a multistage fashion and configured to be placed on the cover 17 via a heat insulating mount 19, and a lifting mechanism 18 adapted to raise and lower the cover 17 so as to carry in and carry out each substrate holding tool 4 relative to the heating furnace 5. When one substrate holding tool 4 is in the heating furnace 5, the other substrate holding tool 4 is placed on a substrate-holding-tool table 22 for loading the substrates W thereon. Each substrate holding tool 4 is carried between the-substrate-holding-tool table 22 and the heat insulating mount 19 due to the substrate-holding-tool carrier mechanism 23. To the substrate-holding-carrier mechanism 23, a fall-down prevention member 37 adapted to control each substrate holding tool 4 is provided.

22 Claims, 15 Drawing Sheets

U.S. PATENT DOCUMENTS

| | | | |
|---|---|---|---|
| 6,206,974 B1 * | 3/2001 | Iida et al. | 118/719 |
| 6,540,469 B2 * | 4/2003 | Matsunaga et al. | 414/416.08 |
| 6,573,198 B2 * | 6/2003 | Boonstra et al. | 438/795 |
| 7,357,846 B2 * | 4/2008 | Fujishima | 156/345.32 |

FOREIGN PATENT DOCUMENTS

| | | |
|---|---|---|
| JP | 2000-150403 | 5/2000 |
| JP | 3378241 | 12/2002 |
| JP | 2004-071618 | 3/2004 |
| JP | 2004-71618 | 3/2004 |
| JP | 3579278 | 7/2004 |

OTHER PUBLICATIONS

Chinese Office Action issued on Oct. 13, 2010 for Application No. 200810074119.8 w/ English language translation.

* cited by examiner

VERTICAL TYPE HEAT PROCESSING APPARATUS AND VERTICAL TYPE HEAT PROCESSING METHOD

CROSS REFERENCE TO RELATED APPLICATIONS

This application is based upon the prior Japanese Patent Application No. 2007-33665 filed on Feb. 14, 2007 and Japanese Patent Application No. 2007-195591 filed on Jul. 27, 2007, the entire contents of which are incorporated herein by reference.

BACKGROUND OF THE INVENTION

1. Field of the Invention

The present invention relates to a vertical type heat processing apparatus and a vertical type heat processing method.

2. Background Art

In the manufacture of semiconductor wafers, various processes including oxidation, film forming and the like, are provided to each semiconductor wafer (substrate), and, for example, a vertical type heat processing apparatus (or semiconductor manufacturing apparatus), in which multiple sheets of wafers can be processed in a batch-type manner, has been employed as an apparatus for performing such processes (e.g., see Patent Document 1). The vertical type heat processing apparatus includes a loading area (transfer area) below a vertical type heating furnace having a furnace port at its bottom portion. In the loading area, a boat (or substrate holding tool) is mounted on a cover adapted to open and close the furnace port, via a heat insulating mount. The boat serves to receive and hold, therein, multiple sheets (e.g., 100 to 150 sheets) of wafers each having a large size, for example, a 300 mm diameter. In addition, a lifting mechanism for carrying in and carrying out the boat relative to the heating furnace by raising and lowering the cover, and a loading mechanism for loading or transferring the wafers between the boat and a carrier (or container) containing the plurality of wafers therein are also provided in the loading area.

The boat is made from quartz, which is quite expensive. The wafers are also expensive, thus the production cost will be more increased with further progress of the processing steps. Accordingly, handling of these components or materials must be carried out with greater care.

However, in the batch-type semiconductor manufacturing apparatus described above, the construction of the apparatus poses various restrictions on the conditions for the software and hardware, as such making it difficult to render the apparatus better suited for an earthquake resistant construction or earthquake-proof function, thus being currently insufficient against earthquake related problems. Therefore, when an earthquake occurs and the apparatus experiences a greater shake, fall down of the boat and serious breakdown of the boat and wafers may tend to be caused, leading to drastic damage.

To address these problems, in the vertical type heat processing apparatus described in the Patent Document 1, a structure for connecting and fixing a bottom plate of the substrate holding tool and the heat insulating mount to each other by using a substrate-holding-tool fixing member is employed.

Patent Document 1: TOKKYO No. 3378241, KOHO

In the vertical type heat processing apparatuses, those employing the so-called two-boat system have been known. This vertical type heat processing apparatus employs two boats and includes a boat table adapted for placing the boat thereon so as to perform the loading of the wafers, and a boat carrier mechanism adapted for carrying the boat between the boat table and the heat insulating mount. In such a vertical type heat processing apparatus, while one of the boats is carried into the heating furnace and subjected to a heating process, the other boat placed on the boat table can be used for loading the semiconductor wafers therein.

However, in the vertical type heat processing apparatus employing such a two-boat system, replacing of the two boats on the heat insulating mount should make it difficult to achieve the structure for connecting and fixing the substrate holding tool to the heat insulating mount by using the substrate-holding-tool fixing member. Thus, there is a risk that the boat mounted on the heat insulating mount, the boat placed on the boat table as well as the boat on the boat carrier mechanism may take a fall when experiencing an external force, such as an earthquake or the like. Previously, the applicant has filed "Vertical Type Heat processing apparatus and Vertical Type Heat processing method", this invention being intended to prevent the fall down of the boat placed on the heat insulating mount and the boat on the boat table.

SUMMARY OF THE INVENTION

The present invention was made in view of the above circumstances, and it is therefore an object thereof to provide a vertical type heat processing apparatus and a vertical type heat processing method, which can prevent the fall down of the boat placed on the boat carrier mechanism from being caused by an external force, such as an earthquake or the like, by employing a simple structure, while taking a form of the two-boat system.

The present invention is a vertical type heat processing apparatus, comprising: a heating furnace having a furnace port formed at a bottom portion thereof; a pair of substrate holding tools each adapted to hold multiple substrates in a multistage fashion and configured to be carried into the heating furnace so as to provide a heating process to the substrates; a cover adapted to close the furnace port of the heating furnace; a heat insulating mount provided on the cover; a lifting mechanism adapted to raise and lower the cover; a substrate-holding-tool table provided adjacent to a position just below the heating furnace; and a substrate-holding-tool carrier mechanism adapted to carry each of the pair of substrate holding tools between a position on the heat insulating mount and a position on the table, wherein a fall-down prevention member adapted for preventing fall down of each substrate holding tool is proved to the substrate-holding-tool carrier mechanism.

The present invention is the vertical type heat processing apparatus described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, and wherein the fall-down prevention member includes a restriction piece configured to be opposed to a top face of the bottom plate supported by the supporting part, with a gap.

The present invention is the vertical type heat processing apparatus described above, wherein the fall-down prevention member further includes a driving unit adapted to laterally project and retract the restriction piece.

The present invention is the vertical type heat processing apparatus described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, and wherein the fall-down prevention member includes a top-plate pressing down part provided to extend upward behind the supporting part and adapted to press down the top plate of the substrate holding tool.

The present invention is the vertical type heat processing apparatus described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a restriction groove is formed in the top face of the bottom plate of the substrate holding tool, and wherein the fall-down prevention member includes a restriction bar configured to be opposed to the restriction groove, with a small gap.

The present invention is the vertical type heat processing apparatus described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a pair of parallel lateral holes are formed in both side portions of the bottom plate of the substrate holding tool, and wherein the fall-down prevention member includes restriction bars respectively configured to be inserted in the lateral holes.

The present invention is the vertical type heat processing apparatus described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a pair of side grooves are formed in both side faces of the bottom plate of the substrate holding tool, and wherein the fall-down prevention member includes restriction bars respectively configured to be inserted in the side grooves.

The present invention is the vertical type heat processing apparatus described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a vertical hole is formed in the bottom plate of the substrate holding tool, and wherein the fall-down prevention member is composed of a restriction projection projected upward from the top face of the supporting part and configured to be fitted in the vertical hole, with a small gap.

The present invention is the vertical type heat processing apparatus described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein the bottom plate of the substrate holding tool is formed into a ring-like shape, and wherein the fall-down prevention member is composed of a plurality of restriction projections each projected upward from the top face of the supporting part and configured to be opposed to the inner circumferential wall of the ring-like bottom plate, with a small gap.

The present invention is a vertical type heat processing method, comprising the steps of: placing one substrate holding tool holding multiple substrates in a multistage fashion, on a cover adapted to close a furnace port of a heating furnace, via a heat insulating mount, and elevating the cover so as to carry the one substrate holding tool into the heating furnace; performing a heating process to the substrates in the heating furnace; loading other substrates onto the other substrate holding tool placed on a substrate-holding-tool table, during the heating process for the substrates; and replacing the one substrate holding tool placed on the heating mould to be carried out from the heating furnace after the heating process with the other substrate holding tool placed on the-substrate-holding-tool table, by using a substrate-holding-tool carrier mechanism, wherein the substrate-holding-tool carrier mechanism includes a fall-down prevention member, whereby each substrate holding member can be carried while fall down of the one substrate holding tool as well as the fall down of the other substrate holding tool can be prevented by the fall-down prevention member.

The present invention is the vertical type heat processing method described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, and wherein the fall-down prevention member includes a restriction piece configured to be opposed to a top face of the bottom plate supported by the supporting part, with a gap.

The present invention is the vertical type heat processing method described above, wherein the fall-down prevention member further includes a driving unit adapted to laterally project and retract the restriction piece.

The present invention is the vertical type heat processing method described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, and wherein the fall-down prevention member includes a top-plate pressing down part provided to extend upward behind the supporting part and adapted to press down the top plate of the substrate holding tool.

The present invention is the vertical type heat processing method described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a restriction groove is formed in the top face of the bottom plate of the substrate holding tool, and wherein the fall-down prevention member includes a restriction bar configured to be opposed to the restriction groove, with a small gap.

The present invention is the vertical type heat processing method described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a pair of parallel lateral holes are formed in both side portions of the bottom plate of the substrate holding tool, and wherein the fall-down prevention member includes restriction bars respectively configured to be inserted in the lateral holes.

The present invention is the vertical type heat processing method described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a pair of side grooves are formed in both side faces of the bottom plate of the substrate holding tool, and wherein the fall-down prevention member includes restriction bars respectively configured to be inserted in the side grooves.

The present invention is the vertical type heat processing method described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a vertical hole is formed in the bottom plate of the substrate holding tool, and wherein the fall-down prevention member is composed of a restriction projection projected upward from the top face of the supporting part and configured to be fitted in the vertical hole, with a small gap.

The present invention is the vertical type heat processing method described above, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein the bottom plate of the substrate holding tool is formed into a ring-like shape, and wherein the fall-down prevention member is composed of a plurality of restriction projections each projected upward from the top face of the supporting part and configured to be opposed to the inner circumferential wall of the ring-like bottom plate, with a small gap.

Thus, the vertical type heat processing apparatus and the vertical type heat processing method, according to this invention, can securely prevent the fall down of the boat (i.e., the substrate holding tool) on the boat carrier mechanism (i.e., the substrate-holding-tool carrier mechanism) from being caused by an external force, such as an earthquake or the like, by employing a simple structure, while taking a form of the two-boat system.

DETAILED DESCRIPTION OF THE INVENTION EXAMPLES

Figure 1:
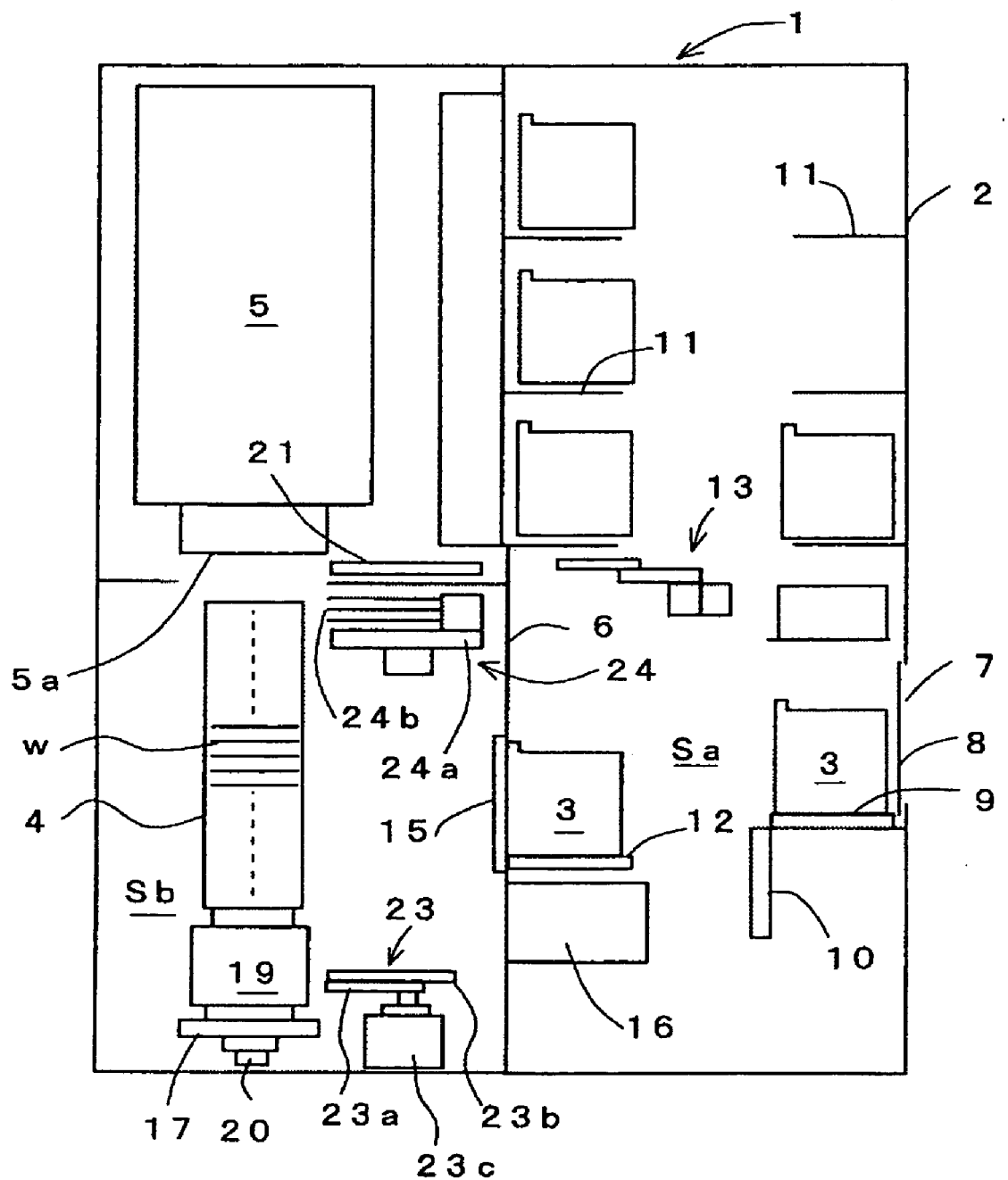
FIG. 1 is a longitudinal cross section schematically showing a vertical type heat processing apparatus according to one embodiment of the present invention.
Figure 2:
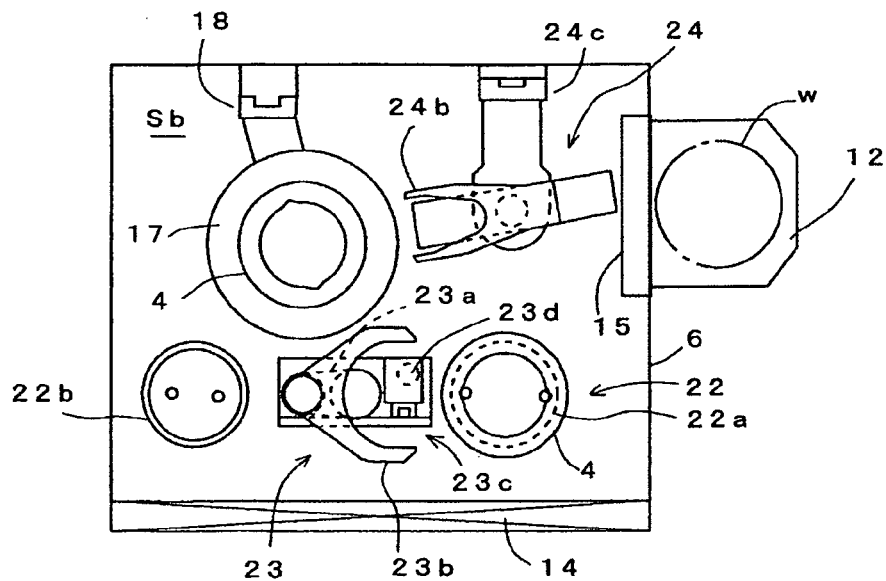
FIG. 2 is a plan view schematically showing a construction in a loading area of the vertical type heat processing apparatus.
Figure 3:
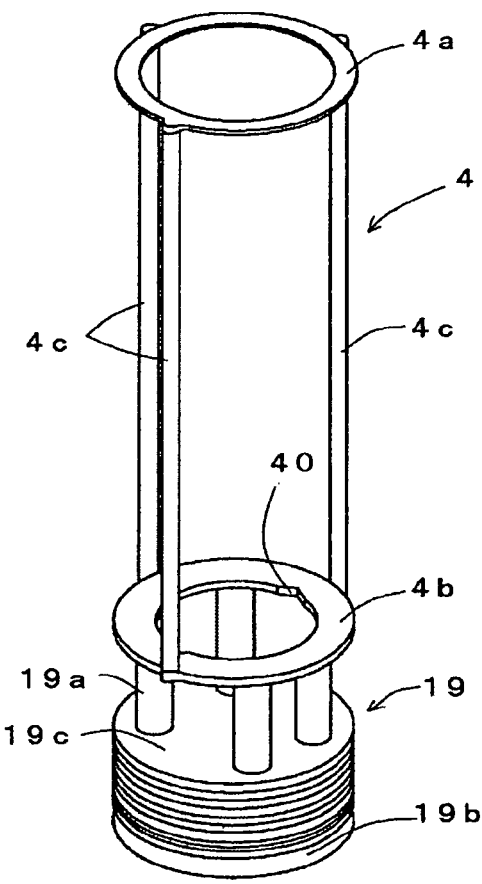
FIG. 3 is a perspective view schematically showing a state in which a wafer boat mounted on a heat insulating mount.
Figure 4:
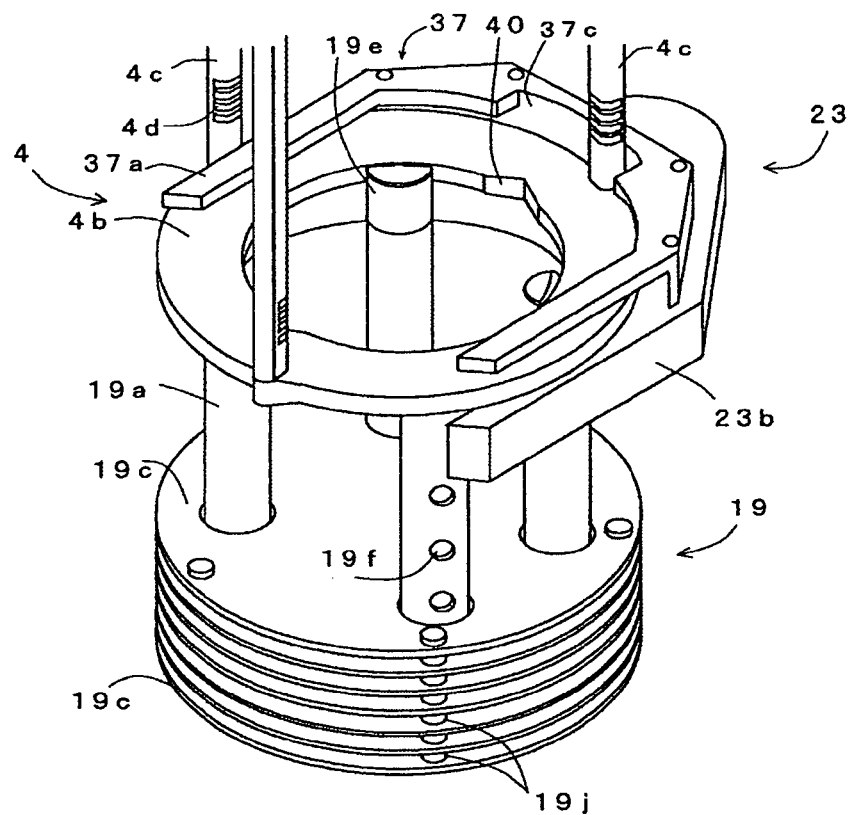
FIG. 4 is a perspective view showing a state in which the wafer boat is mounted on the heat insulating mount by using a carrier mechanism.
Figure 5:
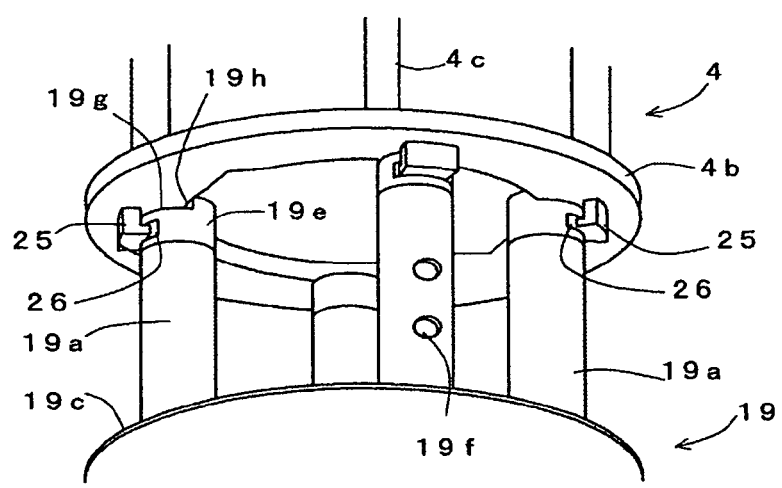
FIG. 5 is a perspective view showing a state in which a locking part and a part to be locked can be engaged with each other.
Figure 6:
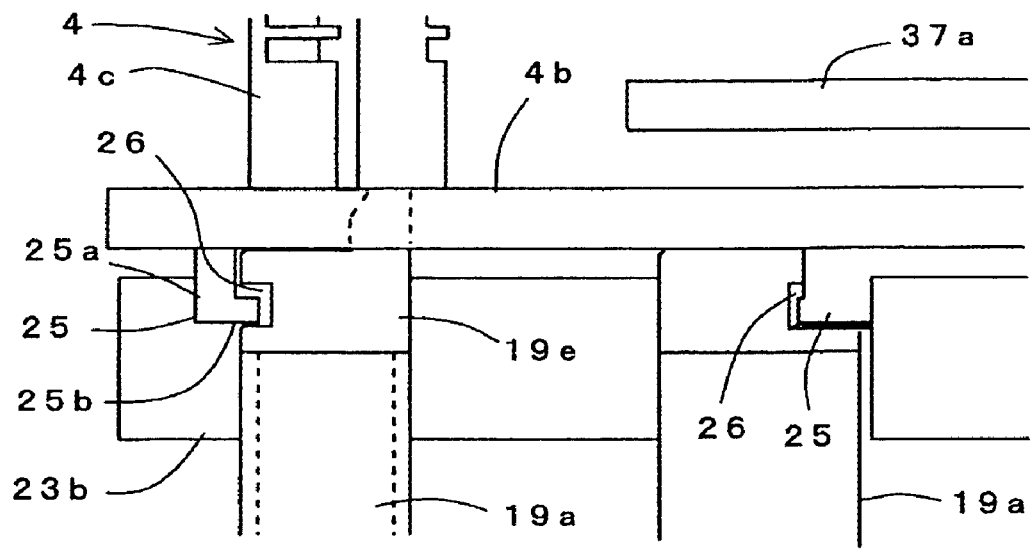
FIG. 6 is a view showing a state in which the wafer boat is mounted on the heat insulating mount.
Figure 7:
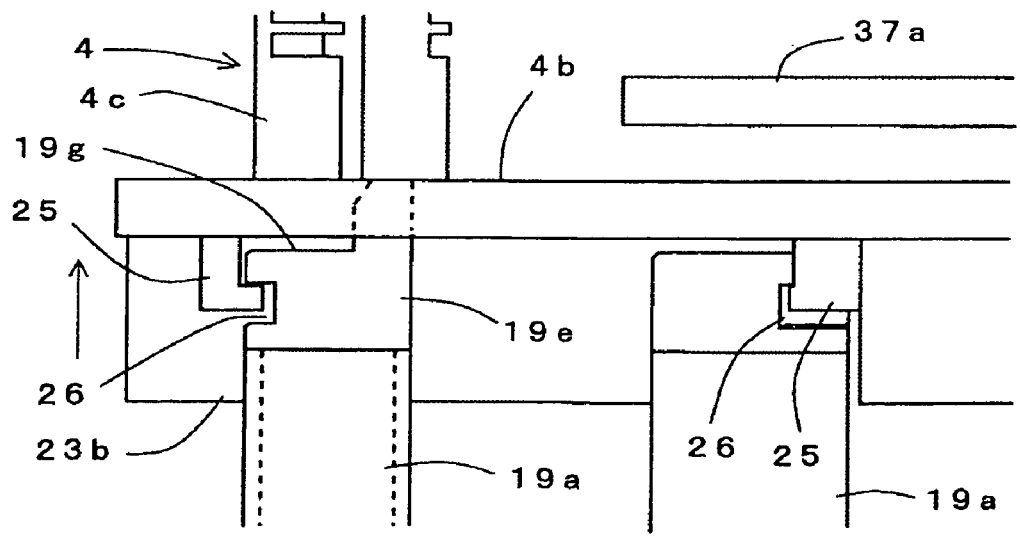
FIG. 7 is a view showing a state in which the wafer boat is elevated to a predetermined level upon carrying it from the heat insulating mount.
Figure 8:
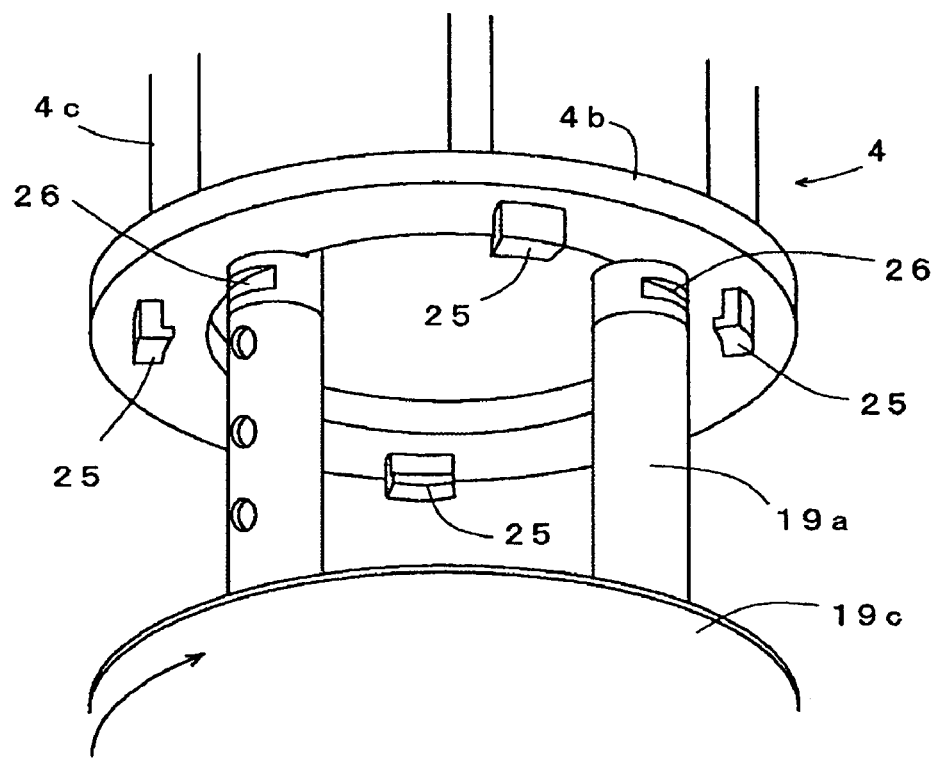
FIG. 8 is a perspective view showing a state in which the heat insulating mount is rotated to be disengaged from the wafer boat while the wafer boat is elevated up to the predetermined level.
Figure 9:
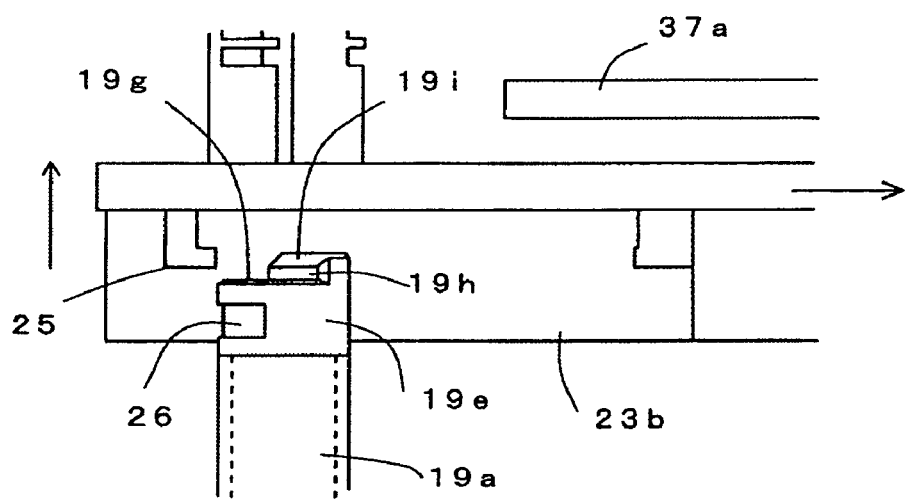
FIG. 9 is a view showing a state in which the wafer boat is further elevated up to a predetermined level from the heat insulating mount and then carried laterally.

Hereinafter, the present invention will be described, based on one embodiment that is currently considered as the best mode of this invention, with reference to the accompanying drawings. FIG. 1 is a longitudinal cross section schematically showing a vertical type heat processing apparatus according to the embodiment of the present invention, FIG. 2 is a plan view schematically showing a construction in a loading area of the vertical type heat processing apparatus, and FIG. 3 is a perspective view schematically showing a state in which a wafer boat mounted on a heat insulating mount. FIG. 4 is a perspective view showing a state in which the wafer boat is mounted on the heat insulating mount by using a carrier mechanism, and FIG. 5 is a perspective view showing a state in which a locking part and a part to be locked can be engaged with each other.

As shown in FIGS. 1 and 2, a semiconductor manufacturing apparatus, for example, a vertical type heat processing apparatus 1, is installed in a clean room. The heat processing apparatus 1 includes a housing 2 constituting an entire outer shell of the apparatus. In the housing 2, a carrying and storing area Sa for carrying and storing carriers (or containers) 3 each containing a plurality of semiconductor wafers (or substrates) W and a loading area Sb as a working area (or transferring area) are provided. The carrying and storing area Sa is separated from the loading area Sb by a partition wall 6.

Additionally, a heating furnace 5 having a furnace port 5a formed at a bottom portion thereof and a pair of boats (or substrate holding tools) 4 each adapted to hold the plurality of wafers W therein and configured to be carried into the heating furnace 5 so as to provide a heating process to the wafers W are arranged in the housing 2.

Each boat 4 can hold multiple sheets, for example, about 100 to 150 sheets, of the wafers W, therein, in the vertical direction, with a predetermined pitch. In the loading area Sb, a loading work for the wafers W can be performed between each boat 4 and each carrier 3, and works for carrying in and carrying out for each boat 4 can be performed relative to the heating furnace 5.

The furnace port 5a of the heating furnace 5 is configured to be closed by a cover 17, while a heat insulating mount 19 is provided on the cover 17. Under the cover 17, a rotating mechanism 20 adapted to rotate the cover 17 together with the heat insulating mount 19 is provided. Additionally, a lifting mechanism 18 adapted to raise and lower the cover 17 is attached to the cover 17.

In the loading area Sb, a table 22 is provided adjacent to a position just below the heating furnace 5, such that each boat 4 can be carried between the heat insulating mount 19 and the table 22 by using a boat carrier mechanism 23.

Each carrier 3 is composed of a plastic container which can contain and carry multiple sheets, for example, about 13 to 25 sheets, of the wafers each having a predetermined size, for example, a 300 mm diameter, in a multistage fashion with a predetermined space, in the vertical direction, while holding each wafer arranged in the horizontal direction. Each carrier 3 has a cover (not shown) detachable thereto, the cover being adapted for airtightly closing a wafer taking out opening formed in a front face of the carrier 3.

A transfer port 7 is provided in a front face portion of the housing 2, for carrying in and carrying out the carrier 3, by an operator or actuation of a carrier robot. To the transfer port 7, a door 8 is provided, such that it can be slidably opened and closed in the vertical direction. In the carrying and storing area Sa, a table 9 for supporting each carrier 3 thereon is provided in the vicinity of the transfer port 7, and a sensor mechanism 10, for detecting, each position and the number of sheets, of the wafers W, by opening the cover of the carrier 3, is provided behind the table 9. Above the table 9 and at an upper portion of the partition wall 6, storing shelves 11 are provided for storing the plurality of carriers 3 thereon.

A loading stage 12 is provided on the partition wall 6 in the loading and storing area Sa, and the stage 12 is for supporting each carrier 3 thereon, for preparing the loading of the wafers. A carrier mechanism 13, for carrying each carrier 3 among the table 9, storing shelves 11 and loading stage 12, is provided in the carrying and storing area Sa.

The carrying and storing area Sa has an atmosphere cleaned by a fan filter unit (not shown). The loading area Sb is also cleaned by a fan filter unit 14 provided on one side thereof, and is kept under a positive pressure atmospheric condition or in an inert gas atmosphere (for example, consisting of $N_2$ gas). In the partition wall 6, an opening (not shown) is formed for bringing the internal space of each carrier 3 into communication with the internal space of the loading area Sb, when the front face of the carrier 3 placed on the loading stage 12 is moved to be in contact with the opening, from the side of the carrying and storing area Sa. A door 15 is provided to open and close the opening of the partition wall 6, from the side of the loading area Sb. The opening provided in the partition wall 6 is formed to have a substantially the same size of the taking out opening of the carrier 3, as such the wafers can be taken in and taken out from the carrier 3 via the opening.

To the door 15 described above, a cover opening and closing mechanism (not shown) for opening and closing the cover of each carrier 3 and a door opening and closing mechanism (not shown) for opening and closing the door 15, from the side of the loading area Sb, are provided. By the cover opening and closing mechanism and the door opening and closing mechanism, the cover and the door 15 can be respectively moved to open toward the loading area Sb. In this case, the cover and the door 15 are respectively configured such that they can be shifted (or retracted) upward or downward to avoid being interference with the loading of the wafers. Below the loading stage 12, a notch aligning mechanism 16 is located for aligning notches provided the respective peripheries of the wafers, in one direction, in order to match their crystal orientations with one another. The notch aligning mechanism 16 is provided to face the loading area Sb and configured to align the notches of the respective wafers to be transferred from each carrier 3 on the loading stage 12 by a loading mechanism 24 as will be described below.

At an upper portion on the back side of the loading area Sb, a vertical type heating furnace 5 having a furnace port 5a at its bottom portion as described above is located. In the loading area Sb, the boat 4 is placed on the cover 17 via the heat insulating mount 19. The boat 4 is made from, for example, quartz, in which multiple sheets (for example, about 100 to 150 sheets) of wafers W are loaded, in a multistage fashion, in the vertical direction, with a predetermined interval. In order to carry in and carry out the boat 4 relative to the heating furnace 5 and open and close the furnace port 5a, a lifting mechanism 18 for raising and lowering the cover 17 is provided. On the top portion of the cover 17, as described above, the heat insulating mount (heat blocking member) 19 is placed for suppressing heat radiation to be generated from the furnace port 5a upon closing the port 5a with the cover 17. The boat 4 is placed on the top portion of the heat insulating mount 19. The heating furnace 5 mainly includes a reaction vessel and a heating unit (heater) provided around the reaction vessel. To the reaction vessel, a gas introducing system adapted to introduce a processing gas and/or inert gas (e.g., $N_2$) into the reaction vessel and an exhaust system including a vacuum pump, which can evacuate the interior of the reaction vessel to a predetermined degree of vacuum, are connected, respectively.

The rotating mechanism 20 adapted to rotate each boat 4 via the heat insulating mount 19 is provided to the cover 17. In the vicinity of the furnace port 5a, a shutter 21 is arranged to be optionally moved (or pivoted) in the horizontal direction so as to selectively open and close the port 5a. The shutter 21 serves to shut off the furnace port 5a when the boat 4 having been subjected to the heating process is carried out from the heating furnace 5 after the cover 17 has been opened. The shutter 21 includes a shutter driving mechanism (not shown) adapted to pivot the shutter 21 in the horizontal direction so as to open and close it.

On one side, i.e., on the side of the fan filter unit 14, of the loading area Sb, a boat table (also referred to as a boat stage or substrate-holding-tool table) 22 is provided for supporting the boat 4 thereon in order to prepare the loading of the wafers W. While the boat table 22 may be a single unit, it is preferred that the table 22 includes two stages, i.e., a first table (or charge stage) 22a and a second table (or standby stage) 22b, which are arranged front and back, along the fan filter unit 14, as shown in FIG. 2.

At a lower portion of the loading area Sb and between the first table 22a and the second table 22b, a boat carrier mechanism (or substrate-holding-tool carrier mechanism) 23 is provided, which is adapted for carrying the boat 4, between the boat table 22 and the heat insulating mount 19 on the cover 17, more specifically, between the first table 22a or second table 22b of the boat table 22 and the heating insulating mould 19 on the cover 17 which is in a lowered position, as well as between the first table 22a and the second table 22b. Additionally, in the loading area Sb, the loading mechanism 24 is provided, which is adapted for loading the wafers W, between each carrier 3 on the loading stage 12 and the boat 4 on the boat table 22, more specifically, between the carrier 3 on the loading stage 12 and the notch aligning mechanism 16, between the notch aligning mechanism 16 and the boat 4 on the first table 22a of the boat table 22, and between the boat 4 after subjected to the heating process on the first table 22a and the vacant carrier 3 on the loading stage 12.

Each boat 4, as shown in FIG. 3, includes a top plate 4a, a bottom plate 4b, and a plurality of, for example, three, struts 4c each provided between the top plate 4a and the bottom plate 4b. In each strut 4c, as shown in FIG. 4, grooves 4d, for holding the wafers, in a multistage fashion, are formed, like a comb, with a predetermined pitch. Two, left and right, struts 4c, located on the front face side, are positioned to define a slightly wider space, in order to facilitate putting in and taking out each wafer through the so-provided space.

The boat carrier mechanism 23 includes arms, which are adapted to support the single boat 4 in the vertical direction and can be extended and contracted in the horizontal direction. Specifically, the boat carrier mechanism 23 includes a first arm 23a, which can be pivoted in the horizontal direction and can be moved in the vertical direction, and a flat and generally U-shaped second arm (hand) 23b, which is supported to be optionally pivoted in the horizontal direction at a distal portion of the first arm 23a and is configured to support a bottom face of the boat 4 (i.e., a bottom face of the bottom plate 4b), a driving unit 23c for driving both of the first arm 23a and second arm 23b, and a lifting mechanism 23d adapted to raise and lower all of these members. In such a configuration, synchronization of the horizontally pivotal movements of the first arm 23a and second arm 23b enables each boat to be carried in a horizontally linear direction. Due to such extension and contraction of the arms, the area in which the boat 4 is to be carried can be minimized, thereby reducing the width and length of the apparatus.

On a top face of the second arm 23b, supporting pieces 60 for supporting the bottom face of the bottom plate 4b of the boat 4 at multiple points are provided. Preferably, the supporting pieces 60 are formed from, for example, a heat-resistant resin, and arranged to support the bottom face of the boat 4 at multiple points, for example, three points.

The loading mechanism 24 includes a horizontally movable base 24a, and multiple sheets, for example, five sheets, of thin-plate like loading arms 24b provided on the base 24a. Each of the loading arms 24b is used for placing a semiconductor wafer thereon and configured to be optionally advanced and retracted relative to the base 24a. For the five loading arms 24b, it is preferred that the central one sheet-feeding type loading arm and the other four loading arms can be advanced and retracted, respectively, in an independent relation, above the base 24a, while the pitch between the other four loading arms can be changed in the vertical direction on the basis of the central loading arm. The base 24a can also be moved in the vertical direction by actuation of a lifting mechanism 24c provided on the other side of the loading area Sb.

In order to prevent fall down of the boat 4 placed on the heat insulating mount 19 to be caused by an external force, such as an earthquake or the like, hooks 25 (locking parts) are provided at the bottom plate 4b of each boat 4, while locking grooves (parts to be locked) 26 to be respectively locked or engaged with the locking parts 25 are provided to an upper portion of the heat insulating mount 19. As shown in FIGS. 5 to 9, the boat 4 and the heat insulating mount 19 can be engaged with and disengaged from each other, by rotating the heat insulating mount 19, over a predetermined angle, for example, 90 degrees, by the rotating mechanism 20, while the boat 4 is positioned just above the heat insulating mount 19, by using the boat carrier mechanism 23.

As shown in FIGS. 3 to 5, each boat 4 has the bottom plate 4b having an annular shape, and the heat insulating mount 19 has a plurality of, for example, four, columns 19a each adapted to support the bottom face of the bottom plate 4b, along the circumferential direction, with an appropriate interval. More specifically, the heat insulating mount 19 includes a disk-like base 19b, the plurality of columns 19a extending upward from the base 19b, and multiple sheets of heat shut off plates 19c arranged in a multistage fashion, with an appropriate space, via each spacer 19j, in the vertical direction, along the columns 19a. These components are formed from, for example, quartz. Each column 19a is of a cylindrical shape and has a top end member 19e integrally formed with the column and closing its opening end. In order to prevent damage or breakage of the columns 19a due to the difference between the internal and external pressures, holes 19f are provided appropriately in the side face of each column 19a, for communicating the internal space of the column with the exterior. At a top end of each column 19a, or in each top end member 19e, a mounting face 19g, on which the bottom face of the bottom plate 14b of each boat 4 is supported, and a positioning part 19h extending upward from the mounting face 19g and adapted to contact with the inner circumference of the bottom plate 4b so as to position the bottom plate 4b are provided. In order to facilitate fitting or engagement of each positioning part 19h relative to the inner circumference of the bottom plate 4b, it is preferred that an inclined face 19i is provided to a top end edge of the positioning part 19h.

In addition, for supporting the annular bottom plate 4b of the boat 4, the diameter of a circle to be circumscribed on the respective columns 19a arranged, with an appropriate space, inwardly along the circumferential direction of the bottom plate 4b, is designed to be smaller than the outer diameter of the bottom plate 4b. Hence, the second arm 23b of the boat carrier mechanism 23 will never interfere with the columns 19a, upon placing the boat 4 on the top end of each column 19a of the heating insulating mould 19, while supporting the bottom face of the bottom plate 4b of the boat 4. As shown in FIGS. 5 to 8, each locking groove 26, as the part to be locked, is formed in an outer side face of each column 19a, while each hook 25 having an L-shaped cross section, as the locking part configured to be locked or engaged with each locking groove 26, is provided to the bottom face of the bottom plate 4b, at a position corresponding to each locking groove 26.

Each hook 25 includes a vertical part 25a extending downward from the bottom face of the bottom plate 4b and a horizontal part 25b projecting radially inward from a bottom end of the vertical part 25a. Each locking groove 26 is configured such that the horizontal part 25b of each corresponding hook 25 can enter the locking groove 26 along the circumferential direction, when the heat insulating mount 19 is rotated by a predetermined angle by the rotating mechanism 20, while the boat 4 is carried and held just above the heat insulating mount 19 by the boat carrier mechanism 23. It should be appreciated that each locking groove 26 is designed to have a width and a depth that will not interfere with the insertion of the horizontal part 25b of each corresponding hook 25 into the groove 26. In this case, after the rotation of the heat insulating mount 19 is stopped in a position allowing for the locking between each hook 25 and each corresponding locking groove 26, the boat 4 will be placed on the columns 19a of the heat insulating mount 19, by further lowering the boat 4 by the actuation of the boat carrier mechanism 23. At this time, it is preferred that the width of each locking groove 26 is designed to avoid the contact between the locking groove 26 and the horizontal part 25b of each corresponding hook 25, because such a design can control or prevent occurrence of undesired particles (see FIG. 6). It is also preferred that the distal end of each horizontal part 25b and the bottom face of each locking groove 26 are respectively formed into a curved face centered at the center of rotation of the heat insulating mount 19.

Figure 10:
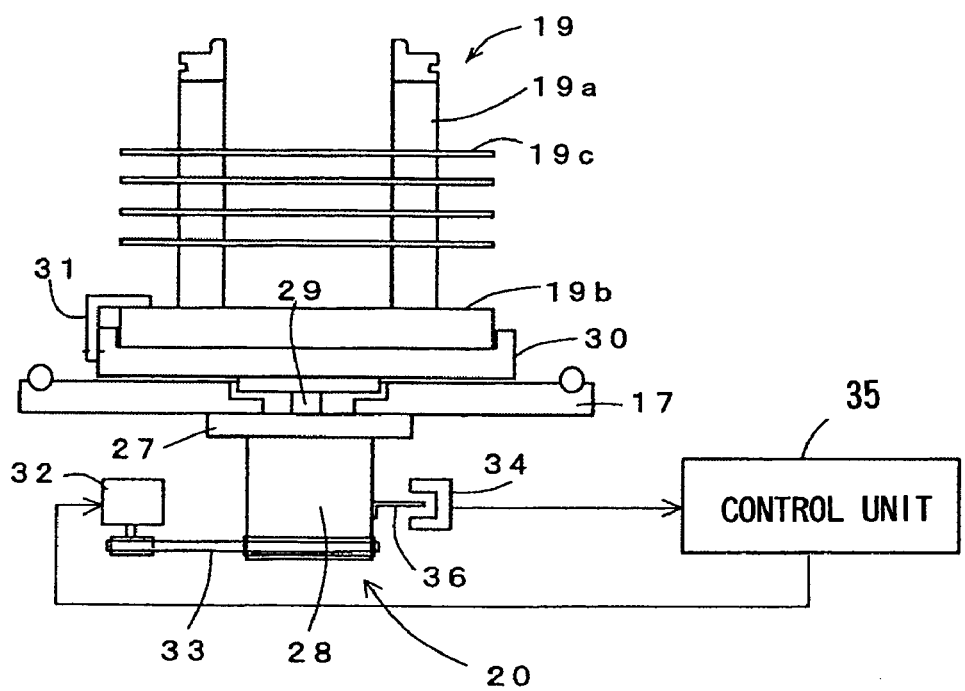
FIG. 10 is a view schematically showing a rotating mechanism of the heat insulating mount.
Figure 11:
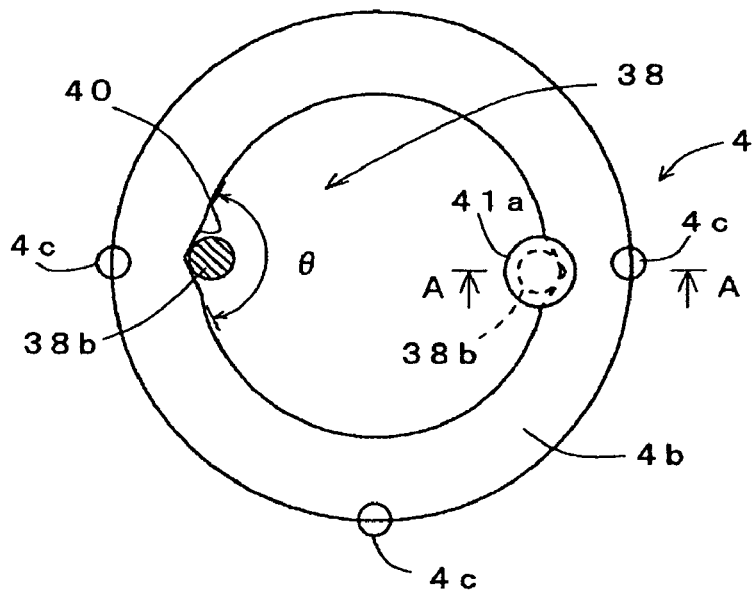
FIG. 11 is a plan view schematically showing a positioning mechanism of the wafer boat on a boat table.
Figure 12:
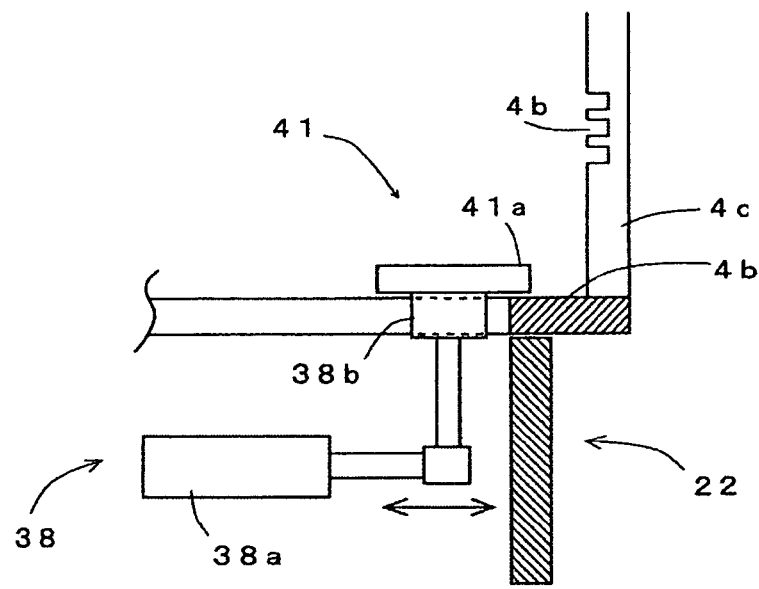
FIG. 12 is an enlarged cross section taken along line A-A of FIG. 11.

As the rotating mechanism 20, the one described, for example, in TOKKYO No. 3579278, KOHO, can be applied. Namely, as shown in FIG. 10, a fixing member 27 having an axial hole is provided at a bottom portion of the cover 17. Around the fixing member 27, a rotary cylinder 28 having a cylindrical shape with a bottom portion is provided rotatably, via bearings or magnetic fluid seals (not shown) disposed at upper and lower portions. To the rotary cylinder 28, a rotation shaft 29 is provided to be freely inserted through the axial hole of the fixing member 27. An upper end portion of the rotation shaft 29 extends freely through a central portion of the cover 17, and a rotary table 30 is attached to the upper end portion of the rotation shaft 29. The rotary table 30 is located to define a gap relative to the top face of the cover 17, and the heat insulating mount 19 is placed on the rotary table 30, wherein the base 19b of the heat insulating mount 19 is fixed to the rotary table 30 via a fixing member 31. To the rotary cylinder 28, a motor 32 for rotating the cylinder 28 is connected via a timing belt 33.

In order to automatically control the rotation of the heat insulating mount 19 to be in a position in which each hook 25 and each corresponding locking groove 26 can be engaged with or disengaged from each other, it is preferred that the rotating mechanism 20 includes a sensor 34 for detecting a point of the origin in the rotating direction of the heat insulating mount 19, and a control unit 35 for controlling the rotation of the heat insulating mount 19, such that the heat insulating mount 19 can take a position for enabling the engagement or a position for enabling the disengagement, between the hooks 25 and locking grooves 26, based on a detection signal to be sent from the sensor 34. At an outer circumferential portion of the rotary cylinder 28, a member to be detected (or kicker) 36 projects outward, and the sensor 34 for detecting the member 36 is located below the cover 17. The control unit 35 is programmed to control the boat 4 to rotate continuously via the heat insulating cylinder 19 during the heating process.

In order to prevent fall down of each boat 4 by an external force, such as an earthquake or the like, during the transfer of the boat 4 to be carried by the boat carrier mechanism 23, a fall-down prevention member 37 is provided at a top portion of the second arm 23b, as shown in FIG. 4 and FIGS. 15 to 23, the fall-down prevention member 37 is provided above the second arm 23b, such that it can hold the bottom plate 4b of the boat 4 from above and below between the member 37 and second arm 23b. As shown in the drawings, the fall-down prevention member 37 is located on the side of a base portion (behind the supporting piece 60) of the top face of the second arm 23b, and includes a restriction piece 37a configured to extend over the top face of the bottom plate 4b of the boat 4 supported on the supporting pieces 60, while being opposed thereto with a predetermined gap.

The fall-down prevention member 37 is composed of a base 37b fixed to the top face of the base portion of the second arm 23b, by a fixing member, for example, a screw 61, and the restriction piece 37a having a flat and generally U-shape and extending forward from the base 37b. The restriction piece 37a and the supporting pieces 60 of the second arm 23b are arranged to define a space therebetween, in which the bottom plate 4b of the boat 4 can be horizontally inserted in a non-contact relation. The restriction piece 37a is formed into a flat and generally U-shape, corresponding to the second arm 23b. In a base portion of the restriction piece 37a, a notch 37c is formed to avoid interference with one of the struts 4c (see FIG. 4). In addition, left and right arm portions of the restriction piece 37a both extending forward are configured to define a space therebetween so as not to interfere with the struts 4c. Similar to the arms 23a, 23b of the boat carrier mechanism 23, the fall-down prevention member 37 is formed from, for example, aluminum.

Furthermore, in order to prevent fall down of each boat 4 placed on the boat table 22, by an external force, such as an earthquake or the like, the following structures are employed. Namely, as shown in FIGS. 2, 11, 12, and 14 to 15, a boat positioning mechanism (or substrate-holding-tool positioning mechanism) 38 for positioning each boat 4 is provided to the boat table 22. The boat positioning mechanism 38 includes a pair of rollers 38b, which can be moved to be closer to and spaced away from each other in the diametrical direction, on the boat table 22, due to actuation of a cylinder 38a. On the other hand, in the inner circumference of the bottom plate 4b of the boat 4, V-shaped positioning and engaging grooves 40 are provided to be opposed to each other. Each positioning and engaging groove 40 are configured to be engaged with each roller 38b when the rollers 38 are spread or spaced away from each other. Each positioning and engaging groove 40 is opened to define a predetermined angle θ, for example 120 degrees. Thus, even though the boat 4 is placed on the boat table 22 while being slightly shifted from a proper position, the boat 4 can be repositioned correctly due to such an opening construction.

On the boat table 22, a boat grasping mechanism (or substrate-holding-tool grasping mechanism) 42 is provided, which serves to grasp the boat to prevent fall down thereof. The boat grasping mechanism 41 includes disk-like grasping parts 41a each provided at an upper portion of each corresponding roller 38b. Each grasping part 41a is configured to be opposed to the top face of the bottom face 4b of the boat 4 when the corresponding roller 38b is engaged with the positioning and engaging groove 40 so as to grasp the bottom plate 4b between the grasping part 41a and the boat table 22 (more specifically, a top face of the boat table).

More specifically, each boat table 22 includes a fixing plate 42 and a top plate 44, which is supported on the fixing plate 42, movably in the horizontal direction, via a ball bearing 43. In this manner, the boat 4 is placed on the top plate 44. The fixing plate 42 and the top plate 44 are formed into an annular shape, respectively. The ball bearing 43 is composed of an annular holder 43a and a plurality of small balls each held by the holder 43a. The top plate 44 can be moved in the horizontal direction, within a predetermined range, due to a pin 45 projected from either one of the top plate 44 and fixing plate 42 and a controlling hole 46 formed in the other one of the top plate 44 and fixing plate 42 such that the pin 45 can be loosely fitted therein. Additionally, a plurality of springs 47 are provided between the top plate 44 and the fixing plate 42, so as to return the center of the top plate 44 to a position corresponding to the center of the boat table 22.

In the boat table 22, especially in the first table 22a, a top plate fixing mechanism 48, for fixing the top plate 44 after the boat 4 has been positioned, is provided, such that the top plate 44 will not be displaced in the horizontal direction during the loading of each wafer W. The top plate fixing mechanism 48 includes a frame 49 having a generally U-shaped cross section, and an air cylinder 50. The frame 49 includes an upper piece 49a and a lower piece 49b. The upper piece 49a is fixed to a bottom face of the top plate 44, and the fixing plate 42 and the ball bearing 43 are interposed between the upper piece 49a and the lower piece 49b with a predetermined gap. The air cylinder 50 is provided to the lower piece 49b of the frame 49, and includes an extensible pressing part 50a configured to fix the fixing plate 42 and the ball bearing 43 by interposing these parts between the pressing part 50a and the upper piece 49a.

Furthermore, each boat table 22 includes a fitting plate 51 for fitting the pair of left and right cylinders 38a, 38a, and a guide 53 is provided to each fitting plate 51. The guide 53 is adapted to support a movable body 52 such that it can be optionally moved in the horizontal direction. Each roller 38b is rotatably supported around an axis of an upper end portion of a column 54 extending upward from the movable body 52. The disk-like grasping part 41a is provided to an upper end of each roller 38b. Since each roller 38b will be in contact with the bottom plate 4b of the boat 4 after the heating process, it is preferred that the roller 38b is formed of a heat resistive resin. On one side of each boat table 22, a sensor 55 is provided for detecting presence or absence of the boat, and a positioning operation will be performed when the sensor 55 detects that the boat 4 is placed on the table.

Next, the operation of the vertical type heat processing apparatus 1 constructed as described above and a vertical type heat processing method will be described. First, one of the boats 4 holding the multiple sheets of wafers W therein and placed on the cover 17 via the heat insulating mount 19 is carried into the heating furnace 5 together with the heat insulating mount 19 by the elevation of the cover 17, and the furnace port 5a of the heating furnace 5 is then closed by the cover 17. Thereafter, the wafers W are subjected to a heating process for a predetermined period of time, at a predetermined temperature, under a predetermined pressure and in a predetermined gas atmosphere, while the boat 4 is rotated in the heating furnace 5 via the heat insulating mount 19 by the rotating mechanism 20. During the heating process, the loading of wafers W onto the other boat 4 placed on the first table 22a of the boat table 22 is performed. In this case, first wafers W, having been subjected to the previous heating process and loaded on the boat 4, are transferred into a vacant carrier 3 placed on the loading stage 12 due to the loading mechanism 24. Thereafter, unprocessed wafers W are loaded onto the vacant boat 4 from another carrier 3, which stored the unprocessed wafers W therein and is then carried onto the loading stage 12.

Once the heating process in the heating furnace 5 is completed, the cover 17 is lowered so as to carry out the boat 4 from the heating furnace 5 into the loading area Sb. Subsequently, the second arm 23b of the boat carrier mechanism 23 approaches the boat 4 in the horizontal direction (see FIG. 6) so as to bring the bottom plate 4b of the boat 4 in a position between the second arm (or hand) 23b and the restriction piece 37a. Thereafter, the boat 4 is raised to a predetermined level due to elevation of the second arm 23b, while the boat 4 is supported by the supporting pieces 60 (see FIG. 7). In this state, each hook 25 and the corresponding locking groove 26 are in positions respectively for enabling disengagement therebetween, after the rotation of the heat insulating mount 19 over a predetermined angle, for example 90 degrees by actuation of the rotating mechanism 20 (see FIG. 8). The boat 4 is further raised up to a higher predetermined level (at the level, each hook will not interfere with each column of the heat insulating mount), as such the boat 4 can be carried out toward the second table 22b of the boat table 22 (see FIG. 9). In this way, the boat 4 can be placed on the second table 22b. During this transfer of the boat 4, the restriction piece 37a of the fall-down prevention member 37 is opposed, with the predetermined gap, to the top face of the bottom plate 4b of the boat 4 supported by the supporting pieces 60 of the second arm 23b. Thus, even through the boat 4 would start to be inclined due to an external force, such as an earthquake, or any other shaking, the inclination can be suppressed or prevented, as such avoiding the fall down of the boat 4. In addition, the boat 4 placed on the second table 22b can be fixedly positioned due to the positioning mechanism 38 as well as firmly held by a disk-like fall-down prevention part 41a, thus the fall-down of the boat 4 can be prevented more securely.

Similarly, the boat 4 placed on the first table 22a can also be fixedly positioned by the positioning mechanism 38 as well as firmly held by the disk-like fall-down prevention part 41a, so as to prevent the fall down of the boat 4. The boat 4 on the first table 22a is then carried to a position above the heat insulating mount 19 on the cover 17 while being supported by the second arm 23b of the boat carrier mechanism 23, after the restriction by the fall-down prevention part 41a is released. Subsequently, the boat 4 is lowered onto the heat insulating mount 19 by actuation of the boat carrier mechanism 23, and just before the boat 4 is mounted on the heat insulating mount 19, the heat insulating mount 19 is rotated by, for example, 90 degrees, due to the rotating mechanism 20, so as to take a position in which each hook 25 and each corresponding locking groove 26 can be locked relative to each other. Thereafter, the boat 4 can be placed on the heat insulating mount 19. In this manner, once the mounting of the boat 4 onto the heat insulating mount 19 is completed, the boat 4 can be carried into the heating furnace 5 due to elevation of the cover 17, and the heating process can then be started. During the heating process, the other boat 4 placed on the second table 22b is carried onto the first table 22a by the boat carrier mechanism 23. Thus, the transfer of the heat-processed wafers into the carrier 3 on the loading stage 12 from the boat 4 by the loading mechanism 24 and then the loading of unprocessed wafers onto the boat 4 from another carrier 3 on the loading stage 12 are performed, in succession, as such enhancing the throughput.

In this way, according to the vertical type heat processing apparatus 1 of this embodiment, the hooks 25 and the locking grooves 26 are provided, to the bottom portions of the boat 4 and to the upper portions of the heat insulating mount 19, respectively, such that each hook 25 and each corresponding locking groove 26 can be locked and disengaged relative to each other, by rotating the heat insulating mount 19, over a predetermined angle, due to the rotating mechanism 20 while the boat 4 is positioned just above the heat insulating mount 19, by the boat carrier mechanism 23. Therefore, this apparatus can prevent the fall down of the boat 4 placed on the heat insulating mount 19, to be potentially caused by an external force, such as an earthquake or the like, by employing such a simple structure, while taking a form of the so-called two-boat system.

In this case, each boat 4 includes an annular bottom plate 4b, and the heat insulating mount 19 includes the plurality of columns 19a for supporting the bottom face of the bottom plate 4b along its circumferential direction with an appropriate space. Each locking groove (i.e., the groove-like portion to be locked) 26 is provided in the outer side face of each column 19a, and the hooks (i.e., the L-shaped locking portions) 25 are provided to the bottom face of the bottom plate 4b, such that each hook 25 can be optionally locked with each corresponding locking groove 26. Thus, both of the locking and releasing between the heat insulating mount 19 and the boat 4 can be ensured and facilitated by employing such a simple structure.

The rotating mechanism 20 includes the sensor 34 for detecting a point of the origin in the rotating direction of the heat insulating mount 19, and the control unit 35 for controlling the rotation of the heat insulating mount 19 to be in the position for enabling the engagement or in the position for enabling the disengagement, between the respective hooks 25 and locking grooves 26, based on the detection signal to be sent from the sensor 34. Thus, both of the locking and releasing between the heat insulating mount 19 and the boat 4 can be further ensured and facilitated.

In particular, since the boat carrier mechanism 23 includes the fall-down prevention member 37 for controlling or preventing the fall-down of the boat 4, the boat 4 can be securely controlled not to fall down upon or during the transfer of the boat 4. Therefore, the present apparatus can prevent the fall down and/or destruction of the boat 4 placed on the boat carrier mechanism 23, to be potentially caused by an external force, such as an earthquake or the like, by employing such a simple structure, while taking a form of the so-called two-boat system. In this case, the boat carrier mechanism 23 includes the supporting pieces 60 each provided for supporting the bottom face of the bottom plate 4b of the boat 4, while the fall-down prevention member 37 includes the restriction piece 37a configured to be opposed, with a predetermined gap, to the top face of the bottom plate 4b supported by the supporting pieces 60. This can further simplify the structure and reduce the production cost.

Furthermore, the boat grasping mechanism 41 is also provided for grasping or holding the boat 4 placed on the boat table 22 in order to prevent the fall down of the boat 4. Thus, the fall down of the boat 4 having been carried on the boat table 22 can be prevented more securely. Therefore, the present apparatus can effectively prevent the fall down of the boat 4 placed on the boat table 22, to be caused by an external force, such as an earthquake or the like, by employing such a simple structure, while taking a form of the so-called two-boat system. In this case, the boat table 22 includes the boat positioning mechanism 38 adapted to position the boat 4, by spreading or separating the pair of extensible rollers 38b relative to each other, so as to engage them with the corresponding positioning and engaging grooves 40 each provided in the inner circumferential portion of the annular bottom plate 4b of the boat 4. Additionally, the boat grasping mechanism 41 includes boat grasping parts 41a each configured to be opposed to the top face of the bottom plate 4b of the boat 4, when the rollers 38b of the boat positioning mechanism 38 are spread or spaced away from each other, and grasp the bottom plate 4 between itself and the boat table 22. Therefore, the positioning for the boat 4, as well as the prevention of the fall down of the boat 4 placed on the boat table 22 to be caused by an external force, such as an earthquake or the like, can be performed simultaneously. This configuration can be achieved only by modifying the rollers 38b of the boat positioning mechanism 38, thereby simplifying the structure and reducing the cost. Accordingly, with the configuration described above, the fall down and/or destruction of the boat 4, due to an earthquake or the like, in all of the cases of placing the boat 4 on the heat insulating mount 19, on the boat table 22 and on the boat carrier mechanism 23, can be securely and effectively prevented.

Figure 13:
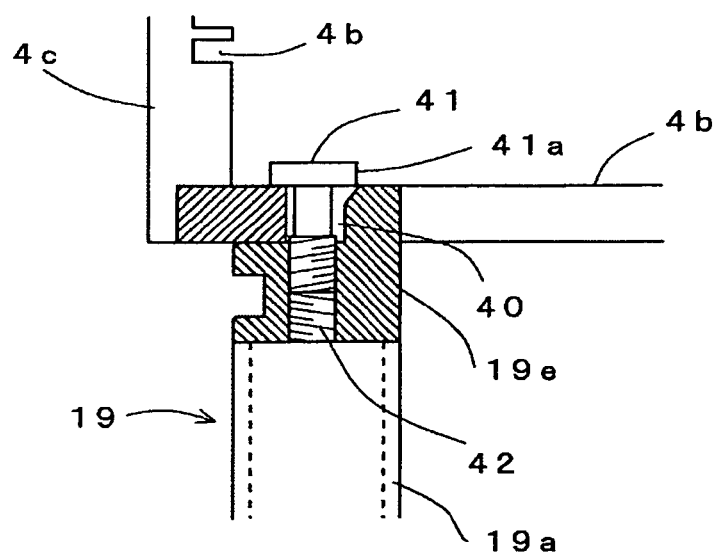
FIG. 13 is an enlarged cross section of a key portion, showing an alternative of the heat insulating mount.
Figure 14:
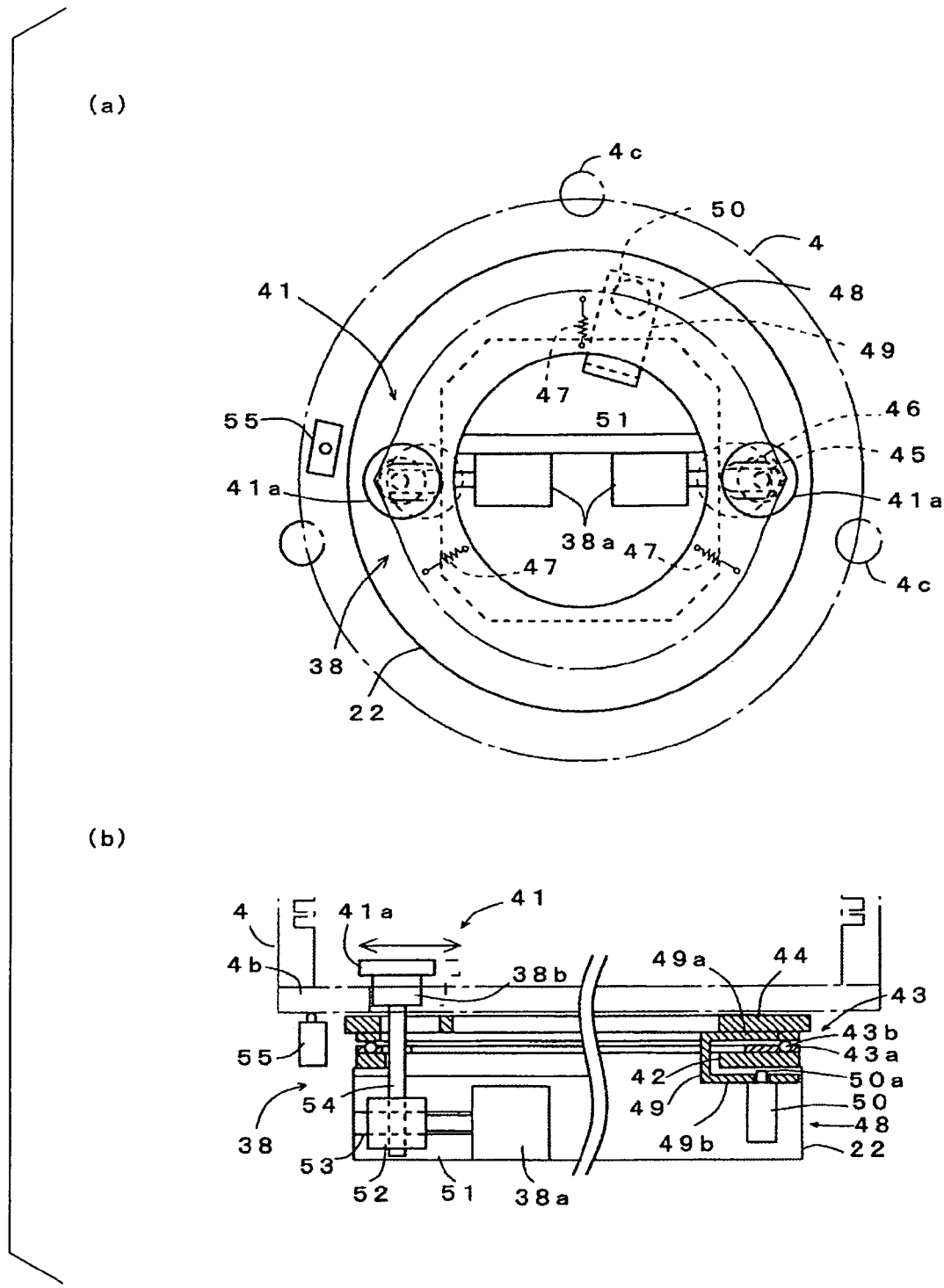
FIG. 14(a) is a schematic plan view showing one example of the boat table.
FIG. 14(b) is a schematic cross section thereof.
Figure 15:
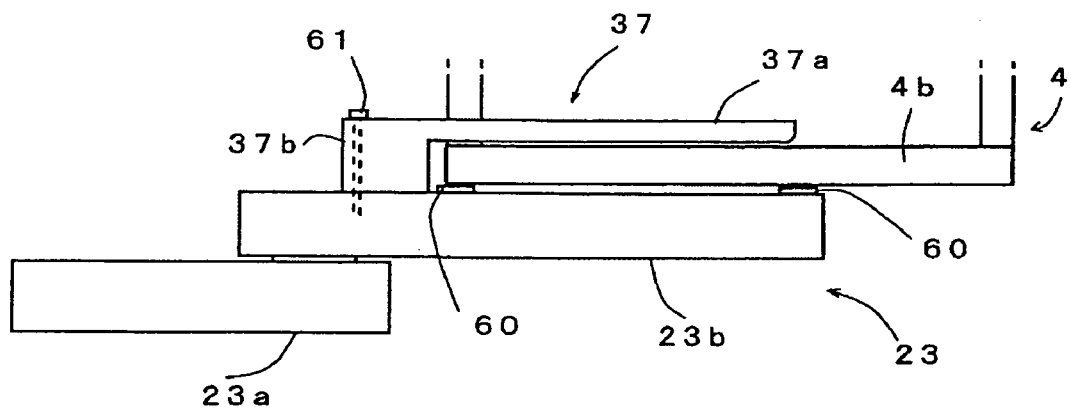
FIG. 15 is a side view showing one example of a boat-fall-down prevention member of the boat carrier mechanism.

FIG. 13 is an enlarged cross section of a key portion, showing an alternative of the heat insulating mount 19. In the heat insulating mount 19 of the alternative embodiment shown in FIG. 13, a female screw hole 42 is provided in the top end member 19e of each column 19a, and the female screw hole 42 is adapted for fixing the bottom plate 4b of the boat 4 to the top end member 19e, in cooperation with an fixing screw 41. Each fixing screw 41 is engaged with the female screw hole 42 after passing through each V-shaped engaging groove 40 of the bottom plate 4b. Thus, a head 41a of the fixing screw 41 is fastened against the top face of the bottom plate 4b, thereby fixing the bottom plate 4b onto each column 19a. With this heat insulating mount 19, the entire body can be utilized as the one-boat system by fixing the heat insulating mount 19 to the boat 4 by using the fixing screws 41. Otherwise, it can also be utilized as the two-boat system by removing the attaching screws 41.

Figure 16:
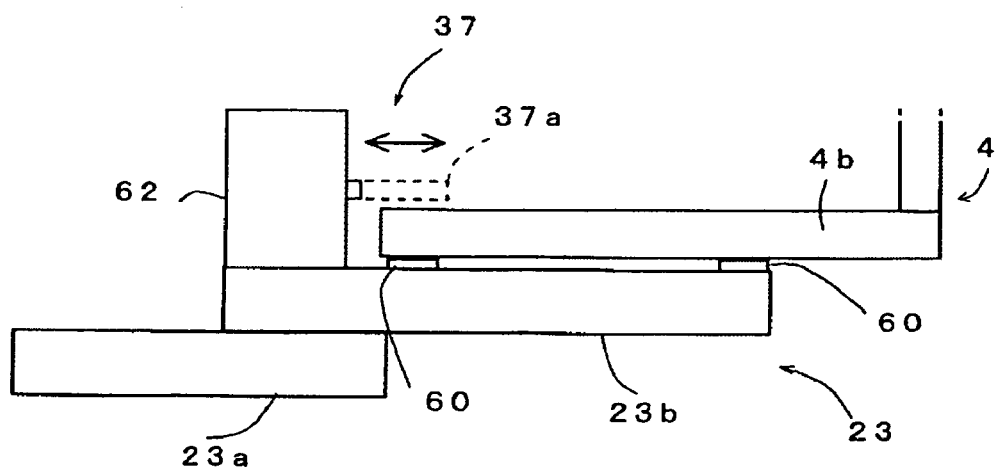
FIG. 16 is a side view showing another example of the boat-fall-down prevention member of the boat carrier mechanism.

FIG. 16 is a side view showing another example of the boat fall-down prevention member of the boat carrier mechanism. The boat carrier mechanism 23 includes supporting pieces 60 each adapted for supporting the bottom face of the bottom plate 4b of the boat 4, and the fall-down prevention member 37 includes a restriction piece 37a configured to be opposed to the top face of the bottom plate 4b of the boat 4 supported by the supporting pieces 60 with a predetermined gap, and a driving unit 62 adapted to laterally project and retract the restriction piece 37a. As the driving unit 62, for example, an air cylinder can be applied. Thus, upon being used, the restriction piece 37a can be projected forward from the base, while upon being unused, it can be retracted (i.e., returned or pulled to its waiting position). Therefore, such a restriction piece 37a will never interfere with the boat 4 during the transferring operation for the boat 4. Of course, according to this embodiment, the same effect as with the previous embodiment can be obtained.

Figure 17:
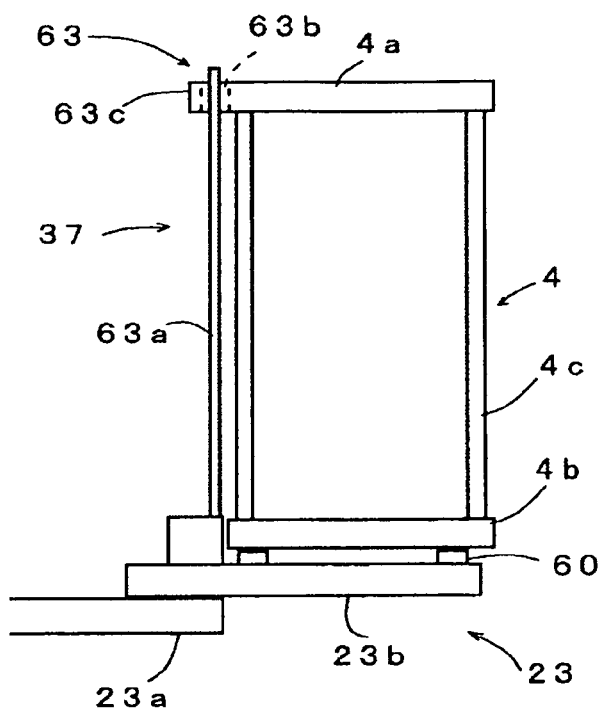
FIG. 17 is a side view showing another example of the boat-fall-down prevention member of the boat carrier mechanism.
Figure 18:
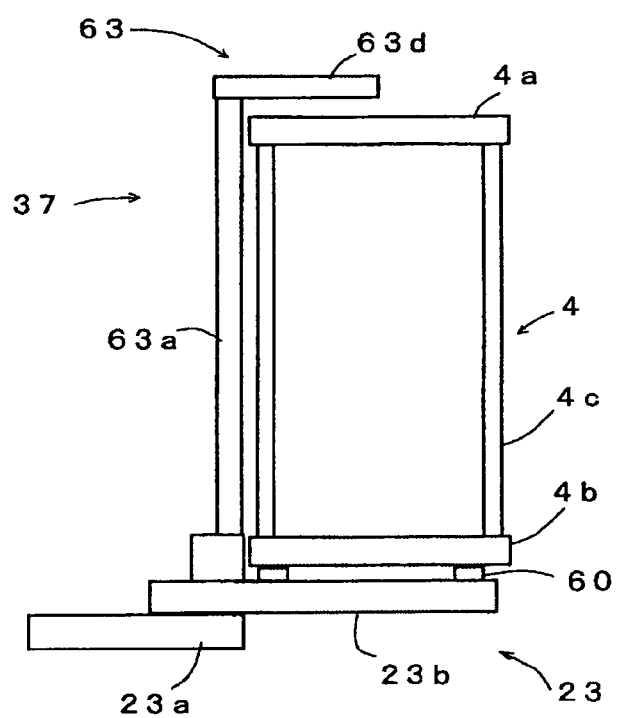
FIG. 18 is a side view showing still another example of the boat-fall-down prevention member of the boat carrier mechanism.
Figure 19:
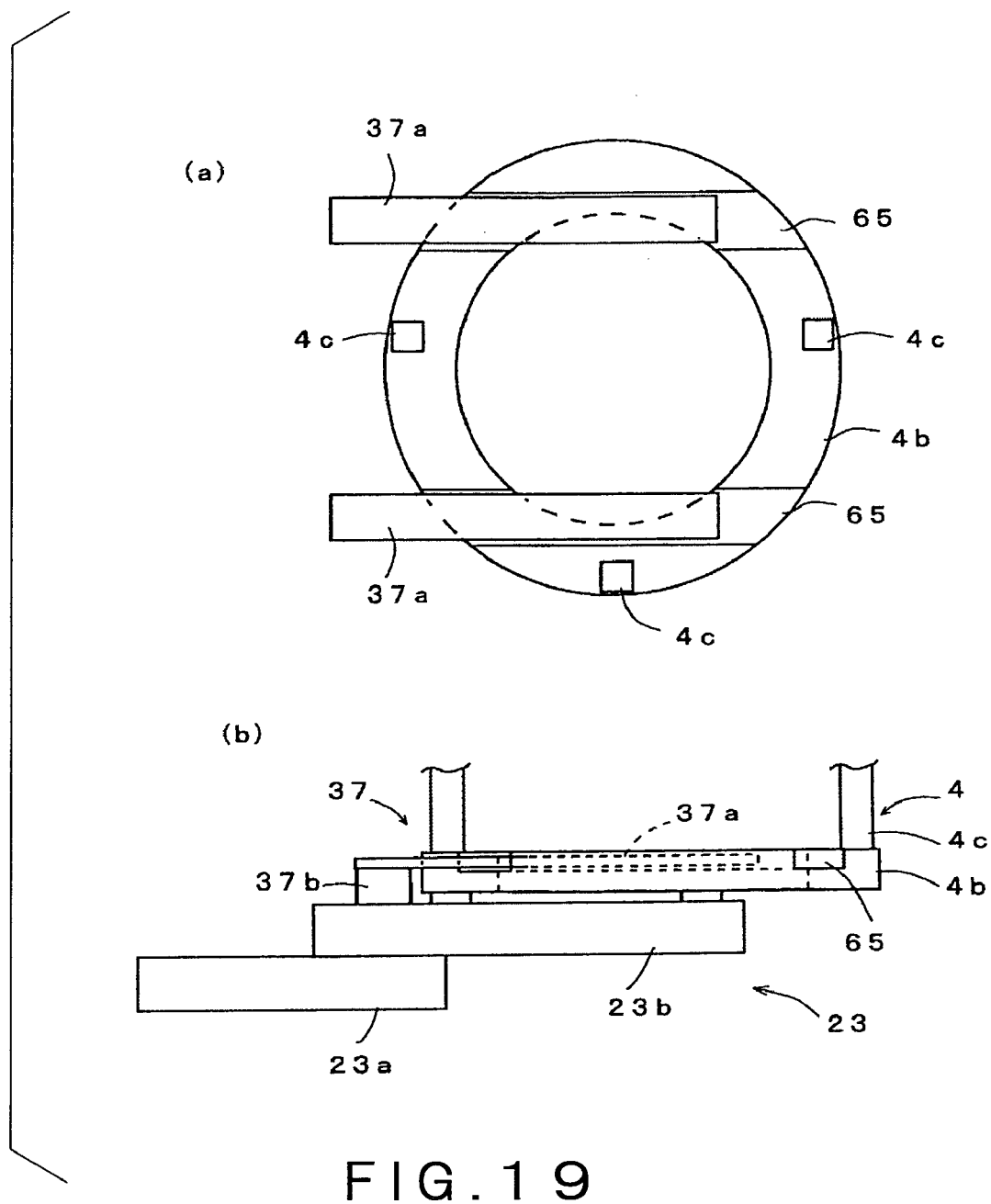
FIG. 19(a) is a plan view showing still another example of the boat-fall-down prevention member of the boat carrier mechanism.
FIG. 19(b) is a side view thereof.

FIGS. 17 and 18 are side views respectively showing other examples of the boat fall-down prevention member of the boat carrier mechanism. In an embodiment shown in FIG. 17, the boat carrier mechanism 23 includes supporting pieces 60 each adapted for supporting the bottom face of the bottom plate 4b of the boat 4, and the fall-down prevention member 37 includes a top-plate pressing down part 63 configured to extend upward behind the supporting pieces 60 and adapted for pressing down the top plate 4a of the boat 4. In this case, the top-plate pressing down part 63 is composed of a column 63a extending upward from the top face of the base of the second arm 23b and a hole 63b provided in the top plate 4a. Through the hole 63b, a distal end of the column 63a can be inserted from below. In order to provide such a hole 63b, an overhanging portion 63c is added to the top plate 4a so as to project in the horizontal direction from the top plate 4a. In this way, the hole 63b is formed vertically in the overhanging portion 63c. It is preferred that the hole 63b is formed slightly larger than the diameter of the column 63a to facilitate the insertion of the column 63a therein. According to this embodiment, when the boat 4 is supported by the supporting pieces 60, the column 63a can be inserted through the hole 63b of the top plate 4a from below, thereby further preventing the fall down of the boat 4.

In an embodiment shown in FIG. 18, the top-plate pressing down part 63 is composed of a column 63a extending upward from the top face of the base of the second arm 23b and a top portion restriction piece 63d provided at a top end of the column 63a and configured to be opposed to the top face of the top plate 4a of the boat 4 with a predetermined gap. The top portion restriction piece 63d is designed to extend horizontally from the top end of the column 63a over the top plate 4a. According to this embodiment, when the boat 4 is supported by the supporting pieces 60, the top portion restriction piece 63d provided at the top end of the column 63a can be opposed to the top face of the top plate 4a, thereby further preventing the fall down of the boat 4.

FIGS. 19 to 23 show plan views and side views, respectively, for illustrating other examples of the boat fall-down prevention member of the boat carrier mechanism. In these drawings, like parts in the previous embodiments are designated by like reference numerals, and will not be detailed below. In an embodiment shown in FIG. 19, the boat 4 includes the bottom plate 4b, the top plate 4a, and the struts 4c each provided between the bottom plate 4b and the top plate 4a and adapted for holding the wafers in a multistage fashion. The boat carrier mechanism 23 includes the second supporting arm 23 (or supporting part) for supporting the bottom face of the bottom plate 4b of the boat 4. In the top face of the bottom plate 4b of the boat 4, a pair of parallel restriction grooves 65 are formed. The fall-down prevention member 37 includes a pair of restriction bars 37a (they are the same as the restriction piece described above) each configured to be fitted in and opposed to each restriction groove 65 with a small gap. Each restriction bar 37a is formed into a thin plate. While in the drawing, the pair of restriction bars 37a are depicted, the fall-down prevention member 37 may be configured to have a generally flat U-shaped form. On the other hand, the restriction grooves 65 are formed into a pair of parallel grooves, corresponding to the restriction bars 37a. A small gap is also provided between each side face of each restriction groove 65 and each side face of each corresponding restriction bar 37a. According to this embodiment, when the boat is shaken due to an earthquake or the like, the side face of each restriction groove 65 will be in contact and engaged with the corresponding side face of each restriction bar 37a, as well as the bottom face of the restriction groove 65 will be in contact and engaged with the bottom face of the restriction bar 37a. Hence, the fall-down of the boat 4 can be securely prevented.

Figure 20:
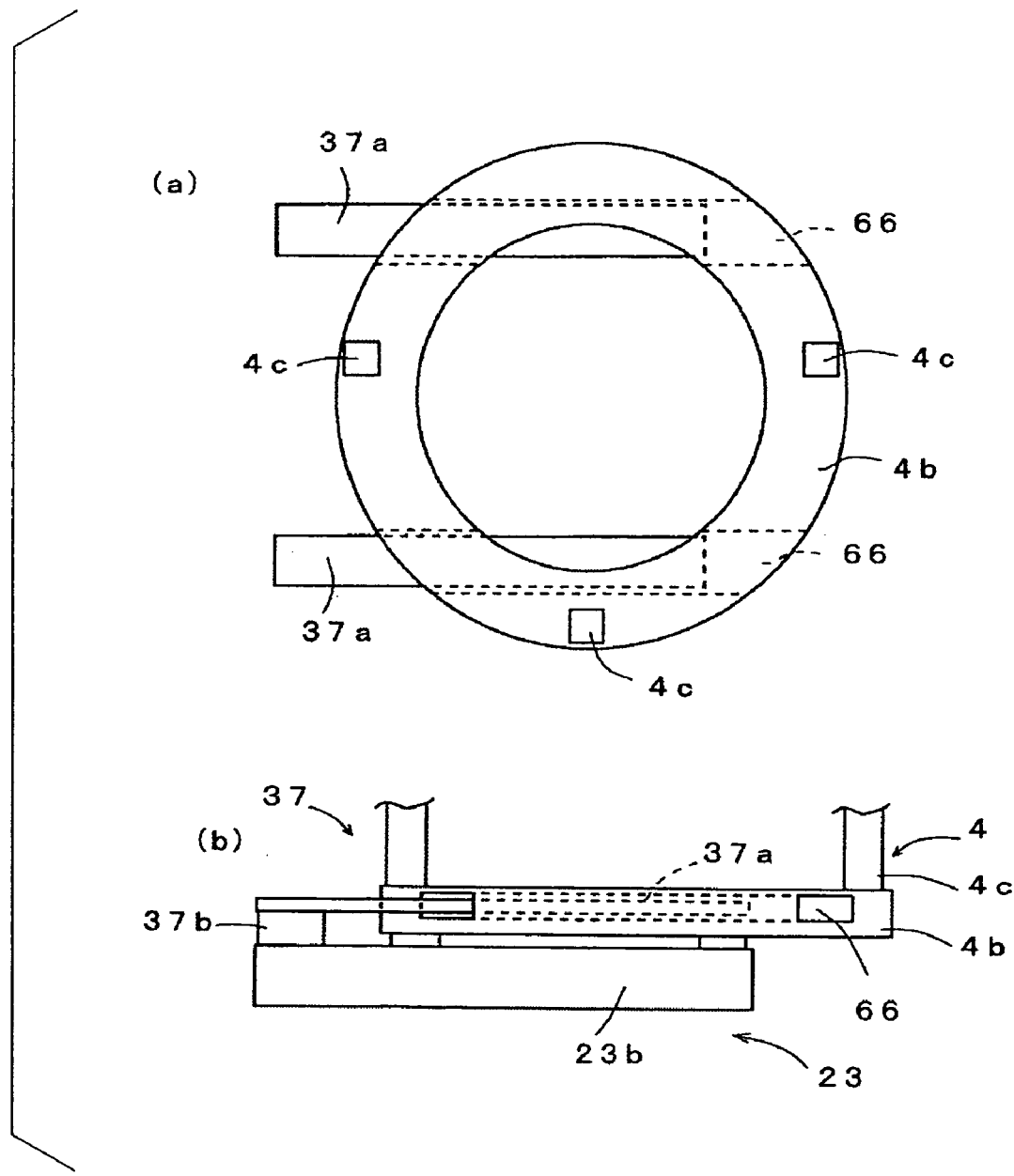
FIG. 20(a) is a plan view showing still yet another example of the boat-fall-down prevention member of the boat carrier mechanism.
FIG. 20(b) is a side view thereof.

In an embodiment shown in FIG. 20, a pair of parallel lateral holes 66 are formed in both side portions of the bottom plate 4b of the boat, and the fall-down prevention member 37 includes restriction bars 37a respectively configured to be inserted in the lateral holes 66. Each lateral hole 66 is formed to have a rectangular cross section, through which each corresponding thin-plate like restriction bar 37a can be loosely inserted. Between each inner wall of each lateral hole 66 and each corresponding restriction bar 37a, a small gap is provided. According to this embodiment, when the boat 4 is shaken due to an earthquake or the like, each inner wall of each lateral hole 66 will be in contact and engaged with the corresponding restriction bar 37a, thereby to securely prevent the fall down of the boat 4.

Figure 21:
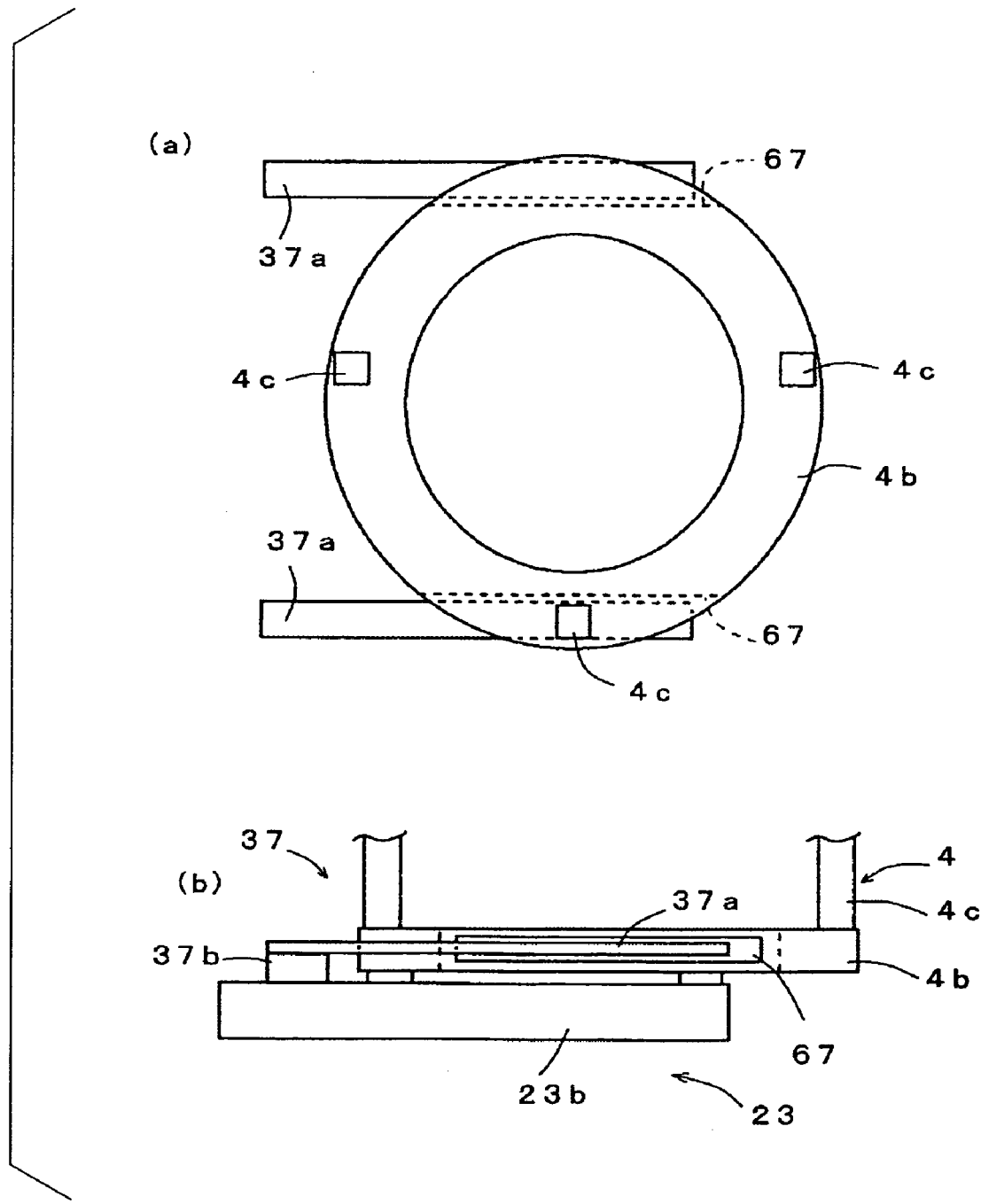
FIG. 21(a) is a plan view showing still yet another example of the boat-fall-down prevention member of the boat carrier mechanism.
FIG. 21(b) is a side view thereof.

In an embodiment shown in FIG. 21, a pair of side grooves 67 are formed in both side faces of the bottom plate 4b of the boat, and the fall-down prevention member 37 includes restriction bars 37a respectively configured to be inserted in the side grooves 67. Each side groove 67 is formed to have a U-shaped cross section, through which each corresponding thin-plate like restriction bar 37a can be loosely inserted. Between each inner wall of each side groove 67 and each corresponding restriction bar 37a, a small gas is provided. According to this embodiment, when the boat 4 is shaken due to an earthquake or the like, each inner wall of each lateral hole 66 will be in contact and engaged with the corresponding restriction bar 37a, thereby achieving secure prevention of the fall down of the boat 4.

Figure 22:
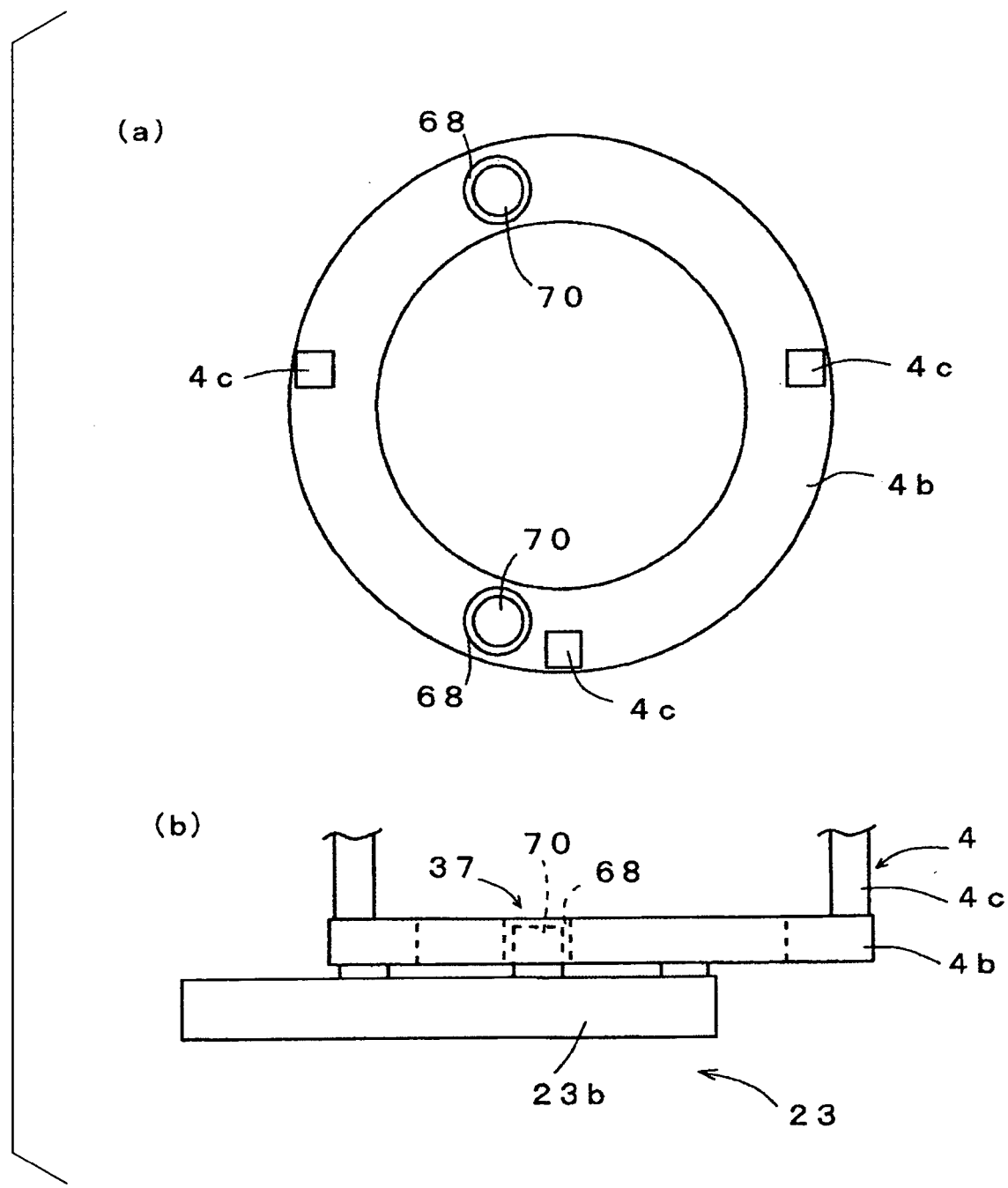
FIG. 22(a) is a plan view showing still yet another example of the boat-fall-down prevention member of the boat carrier mechanism.
FIG. 22(b) is a side view thereof.

In an embodiment shown in FIG. 22, a plurality of vertical holes 68 are formed in the bottom plate 4b of the boat 4, and the fall-down prevention member 37 is composed of restriction projections 70 each projected upward from the top face of the hand (or supporting part) 23b and configured to be fitted in each vertical hole 68 with a small gap. Each vertical hole 68 is formed to have a circular lateral cross section. Preferably, the vertical holes 68 are provided at two, i.e., left and right, points of the bottom plate 4b of the boat 4. While each vertical hole 68 shown in the drawing is a through hole, it may not be extended through the bottom plate 4b, but may be counter-bored in the top face of the bottom plate 4b (spot facing bore). Each restriction projection 70 is formed into a cylindrical shape. According to this embodiment, when the boat 4 is shaken due to an earthquake or the like, the inner circumferential wall of each vertical hole 68 of the bottom plate 4b of the boat 4 will be in contact and engaged with the side face of each corresponding projection 70 extending upward from the hand 23b, thereby to securely prevent the fall down of the boat 4.

Figure 23:
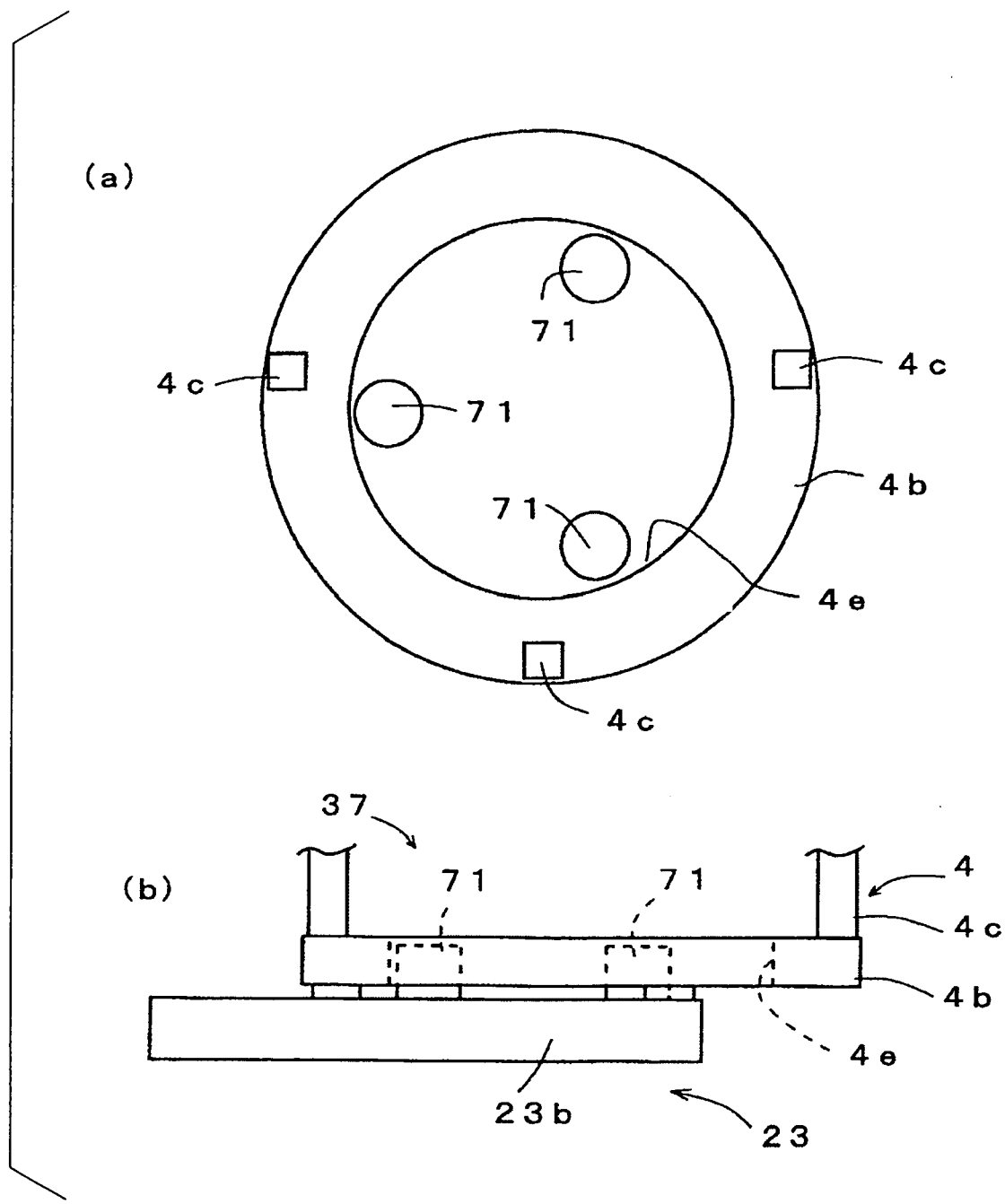
FIG. 23(a) is a plan view showing still yet another example of the boat-fall-down prevention member of the boat carrier mechanism.
FIG. 23(b) is a side view thereof.

In an embodiment shown in FIG. 23, the bottom plate 4b of the boat 4 is formed to have a ring-like shape, and the fall-down prevention member 37 includes a plurality of, for example, three, restriction projections 71 each projected upward from the top face of the supporting part 23b and configured to be opposed to the inner circumferential wall 4e of the ring-like bottom plate 4b with a small gap. Each restriction projection 71 is formed into a cylindrical shape and arranged along the circumferential direction with an equal interval. According to this embodiment, when the boat 4 is shaken due to an earthquake or the like, the inner circumferential wall 4e of the bottom plate 4b of the boat 4 will be in contact and engaged with the side faces of the plurality of restriction projections 71 each extending upward from the hand 23b, as such securely preventing the fall down of the boat 4.

As described above, while the embodiments of the present invention has been shown and described, this invention is not limited to those embodiments, but various modifications in design terms can be made without departing from the spirit and scope of this invention.

The invention claimed is:

1. A vertical type heat processing apparatus, comprising:
   a heating furnace having a furnace port formed at a bottom portion thereof;
   a pair of substrate holding tools each adapted to hold multiple substrates in a multistage fashion and configured to be carried into the heating furnace so as to perform a heating process to the substrates;
   a cover adapted to close the furnace port of the heating furnace;
   a heat insulating mount provided on the cover;
   a lifting mechanism adapted to raise and lower the cover;
   a substrate-holding-tool table provided adjacent to a position just below the heating furnace; and
   a substrate-holding-tool carrier mechanism adapted to carry each of the pair of substrate holding tools between a position on the heat insulating mount and a position on the table, wherein a fall-down prevention member adapted for preventing fall down of each substrate holding tool is fixed to the substrate-holding-tool carrier mechanism, wherein each substrate holding tool has a bottom plate, a top plate, and struts each provided between the bottom plate and the top plate and adapted to hold the substrates in a multistage fashion, wherein the substrate-holding-tool carrier mechanism includes a flat and U-shaped supporting part adapted to support a bottom face of the bottom plate of the substrate holding tool, wherein the fall-down prevention member includes a flat and U-shaped restriction piece with a shape corresponding to that of the supporting part, configured to be opposed to a top face of the bottom plate supported by the supporting part, with a gap, and wherein the restriction piece has a base portion in which a notch is formed to avoid interference with one of the struts, and left and right arm portions both extending forward so that the left and right arm portions do not interfere with the struts.

2. The vertical type heat processing apparatus according to claim 1, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, and wherein the fall-down prevention member includes a restriction piece configured to be opposed to a top face of the bottom plate supported by the supporting part, with a gap.

3. The vertical type heat processing apparatus according to claim 2, wherein the fall-down prevention member further includes a driving unit adapted to laterally project and retract the restriction piece.

4. The vertical type heat processing apparatus according to claim 1, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, and wherein the fall-down prevention member includes a top-plate pressing down part provided to extend upward behind the supporting part and adapted to press down the top plate of the substrate holding tool.

5. The vertical type heat processing apparatus according to claim 1, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a restriction groove is formed in the top face of the bottom plate of the substrate holding tool, and wherein the fall-down prevention member includes a restriction bar configured to be opposed to the restriction groove, with a small gap.

6. The vertical type heat processing apparatus according to claim 1, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a pair of parallel lateral holes are formed in both side portions of the bottom plate of the substrate holding tool, and wherein the fall-down prevention member includes restriction bars respectively configured to be inserted in the lateral holes.

7. The vertical type heat processing apparatus according to claim 1, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a pair of side grooves are formed in both side faces of the bottom plate of the substrate holding tool, and wherein the fall-down prevention member includes restriction bars respectively configured to be inserted in the side grooves.

8. The vertical type heat processing apparatus according to claim 1, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a vertical hole is formed in the bottom plate of the substrate holding tool, and wherein the fall-down prevention member is composed of a restriction projection projected upward from the top face of the supporting part and configured to be fitted in the vertical hole, with a small gap.

9. The vertical type heat processing apparatus according to claim 1, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein the bottom plate of the substrate holding tool is formed into a ring-like shape, and wherein the fall-down prevention member is composed of a plurality of restriction projections each projected upward from the top face of the supporting part and configured to be opposed to the inner circumferential wall of the ring-like bottom plate, with a small gap.

10. The vertical type heat processing apparatus according to claim 1, wherein supporting pieces are formed on the top face of the supporting part of the substrate-holding-tool carrier mechanism, and the restriction piece and the supporting pieces of the supporting part are formed to define a space in which the bottom plate can be horizontally inserted in a non-contact relation.

11. The vertical type heat processing apparatus according to claim 1, wherein the bottom plate of the substrate holding tool has an annular shape, the heat insulating mount has a disc-like base, a plurality of columns extending upward from the base, and a plurality of heat shut off plates arranged with an appropriate space along the columns, and each of the columns has a mounting face on the top thereof for supporting the bottom plate of the boat and a positioning face extending upward from the mounting face for positioning the bottom plate by contacting with the inner circumference of the bottom plate.

12. A vertical type heat processing method, comprising the steps of:
placing one substrate holding tool holding multiple substrates in a multistage fashion, on a cover adapted to close a furnace port of a heating furnace, via a heat insulating mount, and elevating the cover so as to carry the one substrate holding tool into the heating furnace;
performing a heating process to the substrates in the heating furnace;
loading other substrates onto the other substrate holding tool placed on a substrate-holding-tool table, during the heating process for the substrates; and
replacing the one substrate holding tool placed on the heating mould to be carried out from the heating furnace after the heating process with the other substrate holding tool placed on the substrate-holding-tool table, by using a substrate-holding-tool carrier mechanism,
wherein the substrate-holding-tool carrier mechanism includes a fall-down prevention member, whereby each substrate holding member can be carried while fall down of the one substrate holding tool as well as the fall down of the other substrate holding tool can be prevented by the fall-down prevention member, wherein each substrate holding tool has a bottom plate, a top plate, and struts each provided between the bottom plate and the top plate and adapted to hold the substrates in a multistage fashion, wherein the substrate-holding-tool carrier mechanism includes a flat and U-shaped supporting part adapted to support a bottom face of the bottom plate of the substrate holding tool, wherein the fall-down prevention member includes a flat and U-shaped restriction piece with a shape corresponding to that of the supporting part, configured to be opposed to a top face of the bottom plate supported by the supporting part, with a gap, and wherein the restriction piece has a base portion in which a notch is formed to avoid interference with one of the struts, and left and right arm portions both extending forward so that the left and right arm portions do not interfere with the struts.

13. The vertical type heat processing method according to claim 12, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, and wherein the fall-down prevention member includes a restriction piece configured to be opposed to a top face of the bottom plate supported by the supporting part, with a gap.

14. The vertical type heat processing method according to claim 13, wherein the fall-down prevention member further includes a driving unit adapted to laterally project and retract the restriction piece.

15. The vertical type heat processing method according to claim 12, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, and wherein the fall-down prevention member includes a top-plate pressing down part provided to extend upward behind the supporting part and adapted to press down the top plate of the substrate holding tool.

16. The vertical type heat processing method according to claim 12, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a restriction groove is formed in the top face of the bottom plate of the substrate holding tool, and wherein the fall-down prevention member includes a restriction bar configured to be opposed to the restriction groove, with a small gap.

17. The vertical type heat processing method according to claim 12, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a pair of parallel lateral holes are formed in both side portions of the bottom plate of the substrate holding tool, and wherein the fall-down prevention member includes restriction bars respectively configured to be inserted in the lateral holes.

18. The vertical type heat processing method according to claim 12, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a pair of side grooves are formed in both side faces of the bottom plate of the substrate holding tool, and wherein the fall-down prevention member includes restriction bars respectively configured to be inserted in the side grooves.

19. The vertical type heat processing method according to claim 12, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein a vertical hole is formed in the bottom plate of the substrate holding tool, and wherein the fall-down prevention member is composed of a restriction projection projected upward from the top face of the supporting part and configured to be fitted in the vertical hole, with a small gap.

20. The vertical type heat processing method according to claim 12, wherein each substrate holding tool has a bottom plate, a top plate, and struts each provided between the bottom plate and the top plate and adapted to hold the substrates in a multistage fashion, wherein the substrate-holding-tool carrier mechanism includes a supporting part adapted to support a bottom face of the bottom plate of the substrate holding tool, wherein the bottom plate of the substrate holding tool is formed into a ring-like shape, and wherein the fall-down prevention member is composed of a plurality of restriction projections each projected upward from the top face of the supporting part and configured to be opposed to the inner circumferential wall of the ring-like bottom plate, with a small gap.

21. The vertical type heat processing method according to claim 12, wherein supporting pieces are formed on the top face of the supporting part of the substrate-holding-tool carrier mechanism, and the restriction piece and the supporting pieces of the supporting part are formed to define a space in which the bottom plate can be horizontally inserted in a non-contact relation.

22. The vertical type heat processing method according to claim 12, wherein the bottom plate of the substrate holding tool has an annular shape, the heat insulating mount has a disc-like base, a plurality of columns extending upward from the base, and a plurality of heat shut off plates arranged with an appropriate space along the columns, and each of the columns has a mounting face on the top thereof for supporting the bottom face of the bottom plate of the boat and a positioning face extending upward from the mounting face for positioning the bottom plate by contacting with the inner circumference of the bottom plate.

* * * * *